(12) United States Patent
Arney et al.

(10) Patent No.: US 7,381,516 B2
(45) Date of Patent: Jun. 3, 2008

(54) MULTIPHOTON PHOTOSENSITIZATION SYSTEM

(75) Inventors: David S. Arney, St. Paul, MN (US); Catherine A. Leatherdale, St. Paul, MN (US); Manoj Nirmal, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/263,116

(22) Filed: Oct. 2, 2002

(65) Prior Publication Data

US 2004/0067431 A1 Apr. 8, 2004

(51) Int. Cl.
G03F 7/00 (2006.01)
G03F 7/004 (2006.01)

(52) U.S. Cl. ............... 430/270.1; 430/270.1; 430/286.1; 430/170; 430/171; 430/913; 430/914; 430/915; 430/916; 522/7

(58) Field of Classification Search ................. 430/138, 430/270.1, 286.1, 170, 171, 913, 914, 915, 430/916; 522/7
See application file for complete search history.

(56) References Cited

U.S. PATENT DOCUMENTS

| | | |
|---|---|---|
| 3,018,262 A | 1/1962 | Schroeder |
| 3,117,099 A | 1/1964 | Proops et al. |
| 3,502,520 A | 3/1970 | Schwartz |
| 3,583,931 A | 6/1971 | Bouchard |
| 3,729,313 A | 4/1973 | Smith |
| 3,741,769 A | 6/1973 | Smith |
| 3,779,778 A | 12/1973 | Smith et al. |
| 3,808,006 A | 4/1974 | Smith |
| 3,954,475 A | 5/1976 | Bonham et al. |
| 3,987,037 A | 10/1976 | Bonham et al. |
| 4,250,053 A | 2/1981 | Smith |
| 4,257,915 A | 3/1981 | Eaton |
| 4,279,717 A | 7/1981 | Eckberg et al. |
| 4,394,403 A | 7/1983 | Smith |
| 4,394,433 A | 7/1983 | Gatzke |
| 4,642,126 A | 2/1987 | Zador et al. |
| 4,652,274 A | 3/1987 | Boettcher et al. |
| 4,735,632 A | 4/1988 | Oxman et al. |
| 4,751,138 A | 6/1988 | Tumey et al. |
| 4,859,572 A | 8/1989 | Farid et al. |
| 4,889,792 A | 12/1989 | Palazzotto |
| 4,954,416 A | 9/1990 | Wright et al. |
| 4,963,471 A | 10/1990 | Trout et al. |
| 4,970,135 A | 11/1990 | Kushi et al. |
| 5,032,478 A | 7/1991 | Nebe et al. |
| 5,032,490 A | 7/1991 | Nebe et al. |
| 5,047,313 A | 9/1991 | Nebe et al. |
| 5,235,015 A | 8/1993 | Ali et al. |
| 5,238,744 A | 8/1993 | Williams et al. |
| 5,436,279 A | 7/1995 | Grundke et al. |
| 5,545,676 A | 8/1996 | Palazzotto et al. |
| 5,624,782 A | 4/1997 | Hayakawa et al. |
| 5,753,346 A | 5/1998 | Leir et al. |
| 5,856,373 A | 1/1999 | Kaisaki et al. |
| 5,990,479 A | 11/1999 | Weiss et al. |
| 5,998,495 A | 12/1999 | Oxman et al. |
| 6,005,707 A | 12/1999 | Berggren et al. |
| 6,025,406 A | 2/2000 | Oxman et al. |
| 6,043,295 A * | 3/2000 | Oxman et al. .................. 522/14 |
| 6,054,007 A | 4/2000 | Boyd et al. |
| 6,187,833 B1 * | 2/2001 | Oxman et al. .................. 522/15 |
| 6,267,913 B1 | 7/2001 | Marder et al. |
| 6,291,145 B1 | 9/2001 | Kokubo et al. |
| 6,316,153 B1 | 11/2001 | Goodman et al. |
| 6,322,901 B1 | 11/2001 | Bawendi et al. |
| 6,455,103 B1 | 9/2002 | Mennig et al. |
| 6,512,506 B1 | 1/2003 | Shimada |
| 6,512,606 B1 | 1/2003 | Lipson et al. |
| 6,593,392 B2 | 7/2003 | Wang |
| 6,624,915 B1 | 9/2003 | Kirkpatrick et al. |
| 6,656,990 B2 | 12/2003 | Shustack et al. |
| 6,682,872 B2 | 1/2004 | Sachdev et al. |
| 6,750,266 B2 * | 6/2004 | Bentsen et al. .................. 522/2 |
| 6,783,914 B1 * | 8/2004 | Fedynyshyn ................. 430/190 |
| 6,852,766 B1 | 2/2005 | DeVoe |
| 6,913,865 B2 * | 7/2005 | Fedynyshyn ................. 430/191 |
| 7,006,229 B2 | 2/2006 | Sperling et al. |
| 7,008,749 B2 | 3/2006 | Gonsalves |
| 2002/0001763 A1 | 1/2002 | Yasuno et al. |
| 2003/0019517 A1 * | 1/2003 | McFarland .................. 136/256 |
| 2003/0139484 A1 | 7/2003 | Bentsen et al. |
| 2004/0067431 A1 | 3/2004 | Arney et al. |
| 2004/0057451 A1 | 4/2004 | DeVoe et al. |
| 2004/0067450 A1 | 4/2004 | Leatherdale et al. |
| 2004/0068023 A1 | 4/2004 | Leatherdale et al. |
| 2004/0079195 A1 | 4/2004 | Perry et al. |

FOREIGN PATENT DOCUMENTS

| | | |
|---|---|---|
| EP | 0 432 907 | 6/1991 |
| WO | WO 98/21521 | 5/1998 |
| WO | WO 99/26299 | 5/1999 |
| WO | WO 99/50916 | 10/1999 |
| WO | WO 00/17655 | 3/2000 |
| WO | WO 00/17656 | 3/2000 |
| WO | WO 01/61040 | 8/2001 |
| WO | WO 01/96409 | 12/2001 |
| WO | WO 01/96452 | 12/2001 |
| WO | WO 01/96915 | 12/2001 |
| WO | WO 01/96917 | 12/2001 |
| WO | WO 01/96952 | 12/2001 |
| WO | WO 01/96958 | 12/2001 |
| WO | WO 01/96959 | 12/2001 |
| WO | WO 01/96961 | 12/2001 |
| WO | WO 01/96962 | 12/2001 |
| WO | WO 02/079691 | 10/2002 |

OTHER PUBLICATIONS

R. D Allen et al. in Proc. SPIE 2438, 474–477 (1995).
C. Xu and W. W. Webb in J. Opt. Soc. Am. B, 13, 481–491(1996).
I. B. Berlmann in *Handbook of Fluorescence Spectra of Aromatic Molecules*, Second Edition, pp. 24–27, Academic Press, New York (1971).
J. N. Demas and G. A. Crosby in J. Phys. Chem. 75, 991–1024 (1971).
J. V. Morris, M. A. Mahoney, and J. R. Hubber in J. Phys. Chem. 80, 969–974 (1976).
Beringer et al., J. Am. Chem. Soc. 81, 342–351 (1959).
Bull. Chem. Soc. Japan, 42, 2924–2930 (1969).

R.A. Andrievsky, "State-of-the-art and perspectives in the field of particulate nanostructured materials," J. Mater Sci. Technol. 14, 97–103 (1988).

MEMS–vol. 2, Micro–Electro–Mechanical Systems–2000 "Optically–Driven Microstructures Fabricated by Two–Photon Microstereolithography", pp. 695–699.

Stellacci et al., Adv. Mater. vol. 14, No. 3, "Laser and Electron–Beam Induced Growth of Nanoparticles for 2D and 3D Metal Patterning" pp. 194–198.

Hoffman et al., J. Phys. Chem. 1992, 96, pp. 5546–5552.

Steigerwald et al., J. Am. Chem. Soc. 1988, vol. 110, pp. 3046–3050.

Brust et al., J. Chem. Soc. Chem. Commun. 1994, pp. 801–802.

Mills et al., J. Photochem. and Photobiology, Chemistry 108 (1997) pp. 1–35.

Templeton et al., Acc. Chem. Res. 2000, vol. 33, pp. 27–36.

Micic et al. Israel Journal of Chem., vol. 33, pp. 59–65 (1993).

Kamat et al. Journal of Polymer Science Part A ; Polymer Chemistry, vol. 25, pp. 1035–1040 (1987).

Murray et al., J. Am. Chem. Soc. 1993, vol. 115, pp. 8706–8715.

A. P. Alivisatos, Science, vol. 271, pp. 933–937, (Feb. 16, 1996).

S. Empedocles, "Detection and Spectroscopy of Single CdSe Nanocrystallite Quantum Dots" pp. 13–27 (1999).

Hirai et al., J. Phys. Chem B., vol. 104, pp. 8962–8966 (2000).

Lee et al., Adv. Mater., vol. 12, No. 15, pp. 1102–1105 (2000).

Bruchez et al. "Semiconductor Nanocrystals as Fluorescent Biological Labels" pp 1–7 (2002).

Hoffman et al., J. Phys. Chem. vol. 96, pp. 5540–5546 (1992).

Ullrich et al., Semicond. Sci. Technol., vol. 16, L37–L39 (2001).

Hines et al., Journal of Physical Chemistry B, vol. 102, No. 19, pp. 3654–3657 (May 7, 1998).

U.S. Appl. No. 10/033,507, filed Dec. 28, 2001, Multiphoton Photosensitization System.

Cumpston et al., Two–Photon Polymerization Initiators for Three–Dimensional Optical Data Storage and Microfabrication, *Nature*, vol. 398, Mar. 4, 1999, pp. 51–54, XP002270322.

Stellacci et al., One–and Two–Photon Induced Growth of Ligand Coated Nanoparticles for 2 & 3D Metal Patterning, *Proc. SPIE*, vol. 4809, Jul. 9, 2002, pp. 62–68, XP002270320.

Wu et al., Two–Photon Photographic Production of Three–Dimensional Metallic Structures Within A Dielectric Matrix, *Advanced Materials*, vol. 12, No. 19, Oct. 2, 2000, pp. 1438–1441, XP002270323.

Zhou et al., An Efficient Two–Photon–Generated Photoacid Applied to Positive–Tone 3D Microfabrication, *Science*, vol. 296, May 10, 2002, pp. 1106–1109, XP002270321.

Lakowicz et al, "Emission Spectral Properties of Cadmium Sulfide Nanoparticles with Multiphoton Excitation", J. Phys. Chem. B. 106. 5365–5370, 2002 XP–002316823.

* cited by examiner

*Primary Examiner*—Amanda C. Walke
(74) *Attorney, Agent, or Firm*—Lucy C. Weiss

(57) ABSTRACT

A photoreactive composition comprises (a) at least one reactive species that is capable of undergoing an acid- or radical-initiated chemical reaction; and (b) a photoinitiator system comprising photochemically-effective amounts of (1) at least one type of semiconductor nanoparticle quantum dot that has at least one electronic excited state that is accessible by absorption of two or more photons, and (2) a composition, different from said reactive species, that is capable of interacting with the excited state of the semiconductor nanoparticle quantum dot to form at least one reaction-initiating species.

38 Claims, No Drawings

MULTIPHOTON PHOTOSENSITIZATION SYSTEM

FIELD

This invention relates to multiphoton-activatable, photoreactive compositions and to articles derived therefrom.

BACKGROUND

Molecular two-photon absorption was predicted by Goppert-Mayer in 1931. Upon the invention of pulsed ruby lasers in 1960, experimental observation of two-photon absorption became a reality. Subsequently, two-photon excitation has found application in biology and optical data storage, as well as in other fields.

There are two key differences between two-photon induced photoprocesses and single-photon induced processes. Whereas single-photon absorption scales linearly with the intensity of the incident radiation, two-photon absorption scales quadratically. Higher-order absorptions scale with a related higher power of incident intensity. As a result, it is possible to perform multiphoton processes with three-dimensional spatial resolution. Also, because multiphoton processes involve the simultaneous absorption of two or more photons, the absorbing chromophore is excited with a number of photons whose total energy approximates the energy of an electronic excited state of the multiphoton photosensitizer that is utilized. Because the exciting light is not attenuated by single-photon absorption within a curable matrix or material, it is possible to selectively excite molecules at a greater depth within a material than would be possible via single-photon excitation by use of a beam that is focused to that depth in the material. These two phenomena also apply, for example, to excitation within tissue or other biological materials.

Major benefits have been achieved by applying multiphoton absorption to the areas of photocuring and microfabrication. For example, in multiphoton lithography or stereolithography, the nonlinear scaling of multiphoton absorption with intensity has provided the ability to write features having a size that is less than the diffraction limit of the light utilized, as well as the ability to write features in three dimensions (which is also of interest for holography). Such work has been limited, however, to slow writing speeds and high laser powers, due to the low photosensitivities of current multiphoton-activatable, photoreactive compositions.

SUMMARY

Thus, we recognize that there is a need for multiphoton-activatable, photoreactive compositions having improved photosensitivities. The present invention provides such a photoreactive composition that can be efficiently activated by multiphoton absorption. The composition comprises (a) at least one reactive species that is capable of undergoing an acid- or radical-initiated chemical reaction (preferably, a curable species; more preferably, a curable species selected from the group consisting of monomers, oligomers, and reactive polymers); and (b) a multiphoton photoinitiator system comprising photochemically-effective amounts of (1) at least one type of semiconductor nanoparticle quantum dot that has at least one electronic excited state that is accessible by absorption of two or more photons, and (2) a composition, different from the reactive species, that is capable of interacting with the excited state of the semiconductor nanoparticle quantum dot to form at least one reaction-initiating species.

The composition of the invention exhibits enhanced multiphoton photosensitivity by using semiconductor nanoparticle quantum dots as multiphoton photosensitizers. The semiconductor nanoparticle quantum dots interact (for example, through fluorescence up-conversion or charge transfer) with conventional photoinitiator system components to induce chemical reaction through formation of reaction-initiating species (radicals, acid, etc.). Unlike the organic dyes commonly used as multiphoton photosensitizers, the electronic structure (for example, oxidation or reduction potentials and absorption or emission energies) of the semiconductor nanoparticle quantum dots can be matched to that of selected conventional photointiator system components by varying the composition and/or the size of the particles. Furthermore, the semiconductor nanoparticle quantum dots have, large calculated multiphoton absorption cross-sections and thus can be used to address the need that we have recognized for multiphoton-activatable, photoreactive compositions having improved photosensitivity.

In other aspects, this invention also provides a composition resulting from reaction of the above-described photoreactive composition and an article comprising the reacted composition.

DETAILED DESCRIPTION

Definitions

As used in this patent application:

"substantially soluble" means having a solubility greater than about 1.0 percent by weight, based upon the total weight of the photoreactive composition;

"nanoparticle quantum dot" means a particle having an average diameter in the range of about 1 nanometer to about 50 nanometers;

"multiphoton absorption" means the simultaneous or sequential absorption of two or more photons of electromagnetic radiation to reach a reactive, electronic excited state that is energetically inaccessible by the absorption of a single photon of the same energy;

"simultaneous" means two events that occur within the period of $10^{-14}$ seconds or less;

"multiphoton up-converting" means capable of undergoing multiphoton absorption followed by emission of a single photon of higher energy (shorter wavelength) than the photons absorbed;

"electronic excited state" means an electronic state of a semiconductor nanoparticle, molecule, or ion that is higher in energy than its electronic ground state, that is accessible via absorption of electromagnetic radiation, and that has a lifetime greater than $10^{-13}$ seconds;

"cure" means to effect polymerization and/or to effect crosslinking;

"optical system" means a system for controlling light, the system including at least one element chosen from refractive optical elements such as lenses, reflective optical elements such as mirrors, and diffractive optical elements such as gratings. Optical elements shall also include diffusers, waveguides, and other elements known in the optical arts;

"three-dimensional light pattern" means an optical image wherein the light energy distribution resides in a volume or in multiple planes and not in a single plane;

"exposure system" means an optical system plus a light source;

"sufficient light" means light of sufficient intensity and appropriate wavelength to effect multiphoton absorption;

"photosensitizer" means a species that lowers the energy required to activate a photoinitiator by absorbing light of lower energy than is required by the photoinitiator for activation and interacting with the photoinitiator (which is thereby "photosensitized") to produce a photoinitiating species therefrom; and "photochemically effective amounts" (of, for example, the components of the photoinitiator system) means amounts sufficient to enable the reactive species to undergo at least partial reaction under the selected exposure conditions (as evidenced, for example, by a change in density, viscosity, color, pH, refractive index, or other physical or chemical property).

Reactive Species

Reactive species suitable for use in the photoreactive compositions include both curable and non-curable species. Curable species are generally preferred and include, for example, addition-polymerizable monomers and oligomers and addition-crosslinkable polymers (such as free-radically polymerizable or crosslinkable ethylenically-unsaturated species including, for example, acrylates, methacrylates, and certain vinyl compounds such as styrenes), as well as cationically-polymerizable monomers and oligomers and cationically-crosslinkable polymers (which species are most commonly acid-initiated and which include, for example, epoxies, vinyl ethers, cyanate esters, etc.), and the like, and mixtures thereof.

Suitable ethylenically-unsaturated species are described, for example, by Palazzotto et al. in U.S. Pat. No. 5,545,676 at column 1, line 65, through column 2, line 26, and include mono-, di-, and poly-acrylates and methacrylates (for example, methyl acrylate, methyl methacrylate, ethyl acrylate, isopropyl methacrylate, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate,1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethylmethane, trishydroxyethyl-isocyanurate trimethacrylate, the bis-acrylates and bis-methacrylates of polyethylene glycols of molecular weight about 200–500, copolymerizable mixtures of acrylated monomers such as those of U.S. Pat. No. 4,652,274, and acrylated oligomers such as those of U.S. Pat. No. 4,642,126); unsaturated amides (for example, methylene bis-acrylamide, methylene bis-methacrylamide, 1,6-hexamethylene bis-acrylamide, diethylene triamine tris-acrylamide and beta-methacrylaminoethyl methacrylate); vinyl compounds (for example, styrene, diallyl phthalate, divinyl succinate, divinyl adipate, and divinyl phthalate); and the like; and mixtures thereof. Suitable reactive polymers include polymers with pendant (meth)acrylate groups, for example, having from 1 to about 50 (meth)acrylate groups per polymer chain. Examples of such polymers include aromatic acid (meth)acrylate half ester resins such as Sarbox™ resins available from Sartomer (for example, Sarbox™ 400, 401, 402, 404, and 405). Other useful reactive polymers curable by free radical chemistry include those polymers that have a hydrocarbyl backbone and pendant peptide groups with free-radically polymerizable functionality attached thereto, such as those described in U.S. Pat. No. 5,235,015 (Ali et al.). Mixtures of two or more monomers, oligomers, and/or reactive polymers can be used if desired.

Preferred ethylenically-unsaturated species include acrylates, aromatic acid (meth)acrylate half ester resins, and polymers that have a hydrocarbyl backbone and pendant peptide groups with free-radically polymerizable functionality attached thereto.

Suitable cationically-reactive species are described, for example, by Oxman et al. in U.S. Pat. Nos. 5,998,495 and 6,025,406 and include epoxy resins. Such materials, broadly called epoxides, include monomeric epoxy compounds and epoxides of the polymeric type and can be aliphatic, alicyclic, aromatic, or heterocyclic. These materials generally have, on the average, at least 1 polymerizable epoxy group per molecule (preferably, at least about 1.5 and, more preferably, at least about 2). The polymeric epoxides include linear polymers having terminal epoxy groups (for example, a diglycidyl ether of a polyoxyalkylene glycol), polymers having skeletal oxirane units (for example, polybutadiene polyepoxide), and polymers having pendant epoxy groups (for example, a glycidyl methacrylate polymer or copolymer). The epoxides can be pure compounds or can be mixtures of compounds containing one, two, or more epoxy groups per molecule. These epoxy-containing materials can vary greatly in the nature of their backbone and substituent groups. For example, the backbone can be of any type and substituent groups thereon can be any group that does not substantially interfere with cationic cure at room temperature. Illustrative of permissible substituent groups include halogens, ester groups, ethers, sulfonate groups, siloxane groups, nitro groups, phosphate groups, and the like. The molecular weight of the epoxy-containing materials can vary from about 58 to about 100,000 or more.

Useful epoxy-containing materials include those which contain cyclohexene oxide groups such as epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. A more detailed list of useful epoxides of this nature is set forth in U.S. Pat. No. 3,117,099.

Other epoxy-containing materials that are useful include glycidyl ether monomers of the formula

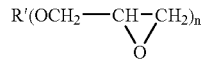

where R' is alkyl or aryl and n is an integer of 1 to 6. Examples are glycidyl ethers of polyhydric phenols obtained by reacting a polyhydric phenol with an excess of a chlorohydrin such as epichlorohydrin (for example, the diglycidyl ether of 2,2-bis-(2,3-epoxypropoxyphenol)-propane). Additional examples of epoxides of this type are described in U.S. Pat. No. 3,018,262, and in *Handbook of Epoxy Resins*, Lee and Neville, McGraw-Hill Book Co., New York (1967).

Numerous commercially available epoxy resins can also be utilized. In particular, epoxides that are readily available include octadecylene oxide, epichlorohydrin, styrene oxide, vinyl cyclohexene oxide, glycidol, glycidylmethacrylate, diglycidyl ethers of Bisphenol A (for example, those available under the trade designations Epon™ 828, Epon™ 825, Epon™ 1004, and Epon™ 1010 from Resolution Performance Products, formerly Shell Chemical Co., as well as DER™-331, DER™-332, and DER™-334 from Dow Chemical Co.), vinylcyclohexene dioxide (for example, ERL-4206 from Union Carbide Corp.), 3,4-epoxycyclohexylmethyl-3,4-epoxycyclohexene carboxylate (for example, ERL-4221 or Cyracure™ UVR 6110 or UVR 6105 from Union Carbide Corp.), 3,4-epoxy-6-methylcyclohexylmethyl-3,4-epoxy-6-methyl-cyclohexene carboxylate (for example, ERL-4201 from Union Carbide Corp.), bis(3,4-epoxy-6-methylcyclohexylmethyl) adipate (for example, ERL-4289 from Union Carbide Corp.), bis(2,3-epoxycyclopentyl) ether (for example, ERL-0400 from Union Carbide Corp.), aliphatic epoxy modified from polypropylene glycol (for example, ERL-4050 and ERL-4052 from Union Carbide Corp.), dipentene dioxide (for example, ERL-4269 from Union Carbide Corp.), epoxidized polybutadiene (for example, Oxiron™ 2001 from FMC Corp.), silicone resin containing epoxy functionality, flame retardant epoxy resins (for example, DER™-580, a brominated bisphenol type epoxy resin available from Dow Chemical Co.), 1,4-butanediol diglycidyl ether of phenol-formaldehyde novolak (for example, DEN™-431 and DEN™-438 from Dow Chemical Co.), resorcinol diglycidyl ether (for example, Kopoxite™ from Koppers Company, Inc.), bis(3,4-epoxycyclohexyl)adipate (for example, ERL-4299 or UVR-6128, from Union Carbide Corp.), 2-(3,4-epoxycyclohexyl-5,5-spiro-3,4-epoxy) cyclohexane-meta-dioxane (for example, ERL-4234 from Union Carbide Corp.), vinylcyclohexene monoxide 1,2-epoxyhexadecane (for example, UVR-6216 from Union Carbide Corp.), alkyl glycidyl ethers such as alkyl $C_8$–$C_{10}$ glycidyl ether (for example, Heloxy™ Modifier 7 from Resolution Performance Products), alkyl $C_{12}$–$C_{14}$ glycidyl ether (for example, Heloxy™ Modifier 8 from Resolution Performance Products), butyl glycidyl ether (for example, Heloxy™ Modifier 61 from Resolution Performance Products), cresyl glycidyl ether (for example, Heloxy™ Modifier 62 from Resolution Performance Products), p-tert-butylphenyl glycidyl ether (for example, Heloxy™ Modifier 65 from Resolution Performance Products), polyfunctional glycidyl ethers such as diglycidyl ether of 1,4-butanediol (for example, Heloxy™ Modifier 67 from Resolution Performance Products), diglycidyl ether of neopentyl glycol (for example, Heloxy™ Modifier 68 from Resolution Performance Products), diglycidyl ether of cyclohexanedimethanol (for example, Heloxy™ Modifier 107 from Resolution Performance Products), trimethylol ethane triglycidyl ether (for example, Heloxy™ Modifier 44 from Resolution Performance Products), trimethylol propane triglycidyl ether (for example, Heloxy™ Modifier 48 from Resolution Performance Products), polyglycidyl ether of an aliphatic polyol (for example, Heloxy™ Modifier 84 from Resolution Performance Products), polyglycol diepoxide (for example, Heloxy™ Modifier 32 from Resolution Performance Products), bisphenol F epoxides (for example, Epon™-1138 or GY-281 from Ciba-Geigy Corp.), and 9,9-bis[4-(2,3-epoxypropoxy)-phenyl]fluorenone (for example, Epon™ 1079 from Resolution Performance Products).

Other useful epoxy resins comprise copolymers of acrylic acid esters of glycidol (such as glycidylacrylate and glycidylmethacrylate) with one or more copolymerizable vinyl compounds. Examples of such copolymers are 1:1 styrene-glycidylmethacrylate, 1:1 methylmethacrylate-glycidylacrylate, and a 62.5:24:13.5 methylmethacrylate-ethyl acrylate-glycidylmethacrylate. Other useful epoxy resins are well known and contain such epoxides as epichlorohydrins, alkylene oxides (for example, propylene oxide), styrene oxide, alkenyl oxides (for example, butadiene oxide), and glycidyl esters (for example, ethyl glycidate).

Useful epoxy-functional polymers include epoxy-functional silicones such as those described in U.S. Pat. No. 4,279,717 (Eckberg), which are commercially available from the General Electric Company. These are polydimethylsiloxanes in which 1–20 mole % of the silicon atoms have been substituted with epoxyalkyl groups (preferably, epoxy cyclohexylethyl, as described in U.S. Pat. No. 5,753,346 (Kessel)).

Blends of various epoxy-containing materials can also be utilized. Such blends can comprise two or more weight average molecular weight distributions of epoxy-containing compounds (such as low molecular weight (below 200), intermediate molecular weight (about 200 to 10,000), and higher molecular weight (above about 10,000)). Alternatively or additionally, the epoxy resin can contain a blend of epoxy-containing materials having different chemical natures (such as aliphatic and aromatic) or functionalities (such as polar and non-polar). Other cationically-reactive polymers (such as vinyl ethers and the like) can additionally be incorporated, if desired.

Preferred epoxies include aromatic glycidyl epoxies (such as the Epon™ resins available from Resolution Performance Products) and cycloaliphatic epoxies (such as ERL-4221 and ERL-4299 available from Union Carbide).

Suitable cationally-reactive species also include vinyl ether monomers, oligomers, and reactive polymers (for example, methyl vinyl ether, ethyl vinyl ether, tert-butyl vinyl ether, isobutyl vinyl ether, triethyleneglycol divinyl ether (Rapi-Cure™ DVE-3, available from International Specialty Products, Wayne, N.J.), trimethylolpropane trivinyl ether (TMPTVE, available from BASF Corp., Mount Olive, N.J.), and the Vectomer™ divinyl ether resins from Allied Signal (for example, Vectomer™ 2010, Vectomer™ 2020, Vectomer™ 4010, and Vectomer™ 4020 and their equivalents available from other manufacturers)), and mixtures thereof. Blends (in any proportion) of one or more vinyl ether resins and/or one or more epoxy resins can also be utilized. Polyhydroxy-functional materials (such as those described, for example, in U.S. Pat. No. 5,856,373 (Kaisaki et al.)) can also be utilized in combination with epoxy- and/or vinyl ether-functional materials.

Non-curable species include, for example, reactive polymers whose solubility can be increased upon acid- or radical-induced reaction. Such reactive polymers include, for example, aqueous insoluble polymers bearing ester groups that can be converted by photogenerated acid to aqueous soluble acid groups (for example, poly(4-tert-butoxycarbonyloxystyrene). Non-curable species also include the chemically-amplified photoresists described by R. D. Allen, G. M. Wallraff, W. D. Hinsberg, and L. L. Simpson in "High Performance Acrylic Polymers for Chemically Amplified Photoresist Applications," J. Vac. Sci. Technol. B, 9, 3357 (1991). The chemically-amplified photoresist concept is now widely used for microchip manufacturing, especially with sub-0.5 micron (or even sub-0.2 micron) features. In such photoresist systems, catalytic species (typically hydrogen ions) can be generated by irradiation, which induces a cascade of chemical reactions. This cascade occurs when hydrogen ions initiate reactions that generate more hydrogen ions or other acidic species, thereby amplifying reaction rate. Examples of typical acid-catalyzed chemically-amplified photoresist systems include deprotection (for example, t-butoxycarbonyloxystyrene resists as described in U.S. Pat. No. 4,491,628, tetrahydropyran (THP) methacrylate-based materials, THP-phenolic materials such as those described in U.S. Pat. No. 3,779,778, t-butyl methacrylate-based materials such as those described by R. D Allen et al. in Proc. SPIE 2438, 474 (1995), and the like); depolymerization (for example, polyphthalaldehyde-based materials); and rearrangement (for example, materials based on the pinacol rearrangements).

Useful non-curable species also include leuco dyes, which tend to be colorless until they are oxidized by acid generated by the multiphoton photoinitiator system, and which, once oxidized, exhibit a visible color. (Oxidized dyes are colored by virtue of their absorbance of light in the visible portion of the electromagnetic spectrum (approximately 400–700 nm).) Leuco dyes useful in the present invention are those that are reactive or oxidizable under moderate oxidizing conditions and yet that are not so reactive as to oxidize under common environmental conditions. There are many such chemical classes of leuco dyes known to the imaging chemist.

Leuco dyes useful as reactive species in the present invention include acrylated leuco azine, phenoxazine, and phenothiazine, which can, in part, be represented by the structural formula:

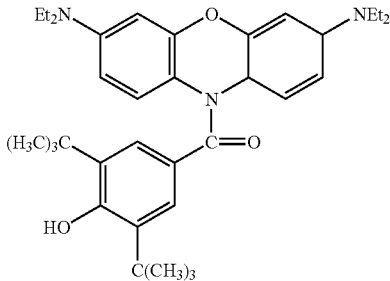

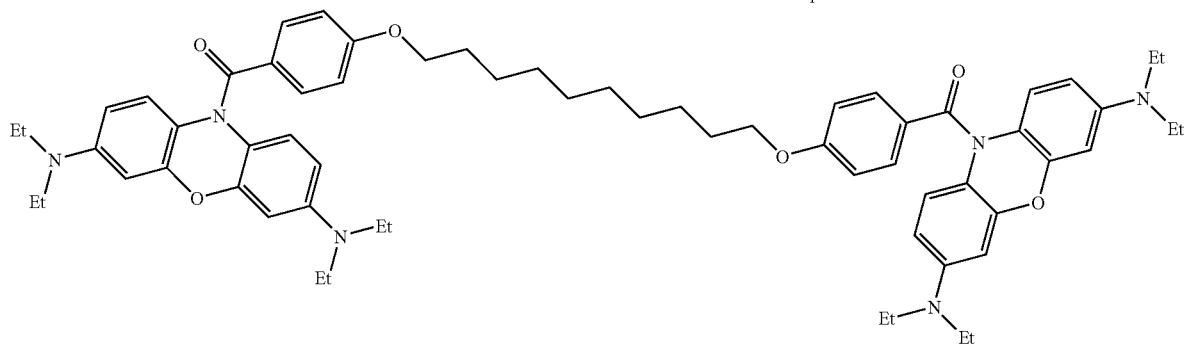

wherein X is selected from O, S, and —N—$R^{11}$, with S being preferred;
$R^1$ and $R^2$ are independently selected from H and alkyl groups of 1 to about 4 carbon atoms; $R^3$, $R^4$, $R^6$, and $R^7$ are independently selected from H and alkyl groups of 1 to about 4 carbon atoms, preferably methyl; $R^5$ is selected from alkyl groups of 1 to about 16 carbon atoms, alkoxy groups of 1 to about 16 carbon atoms, and aryl groups of up to about 16 carbon atoms; $R^8$ is selected from —N($R^1$)($R^2$), H, alkyl groups of 1 to about 4 carbon atoms, wherein $R^1$ and $R^2$ are independently selected and defined as above; $R^9$ and $R^{10}$ are independently selected from H and alkyl groups of 1 to about 4 carbon atoms; and $R^{11}$ is selected from alkyl groups of 1 to about 4 carbon atoms and aryl groups of up to about 11 carbon atoms (preferably, phenyl groups). The following compounds are examples of this type of leuco dye:

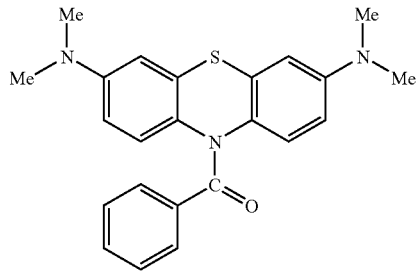

Copichem II

Other useful leuco dyes include, but are not limited to, Leuco Crystal Violet (4,4',4"-methylidynetris-(N,N-dimethylaniline)), Leuco Malachite Green (p,p'-benzylidenebis-(N,N-dimethylaniline)), Leuco Atacryl Orange-LGM (Color Index Basic Orange 21, Comp. No. 48035 (a Fischer's base type compound)) having the structure

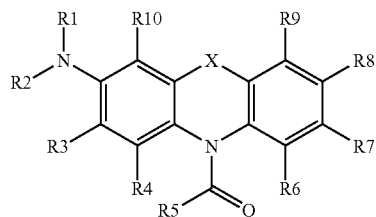

Leuco Atacryl Brilliant Red-4G (Color Index Basic Red 14) having the structure

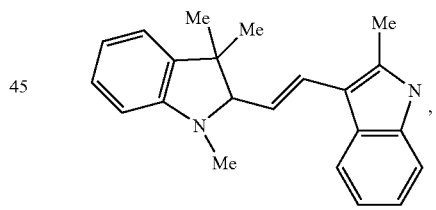

Leuco Atacryl Yellow-R (Color Index Basic Yellow 11, Comp. No. 48055) having the structure

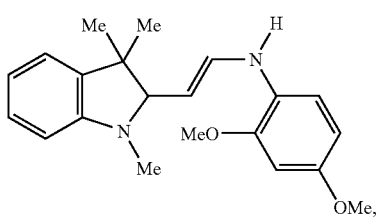

Leuco Ethyl Violet (4,4',4"-methylidynetris-(N,N-diethylaniline), Leuco Victoria Blu-BGO (Color Index Basic Blue 728a, Comp. No. 44040; 4,4'-methylidynebis-(N,N,-dimethylaniline)-4-(N-ethyl- 1-napthalamine)), and LeucoAtlantic Fuchsine Crude (4,4',4"-methylidynetris-aniline).

The leuco dye(s) can generally be present at levels of at least about 0.01% by weight of the total weight of a light sensitive layer (preferably, at least about 0.3% by weight; more preferably, at least about 1% by weight; most preferably, at least about 2% to 10% or more by weight). Other materials such as binders, plasticizers, stabilizers, surfactants, antistatic agents, coating aids, lubricants, fillers, and the like can also be present in the light sensitive layer.

If desired, mixtures of different types of reactive species can be utilized in the photoreactive compositions. For example, mixtures of free-radically-reactive species and cationically-reactive species, mixtures of curable species and non-curable species, and so forth, are also useful.

Semiconductor Nanoparticle Quantum Dots

Semiconductor nanoparticle quantum dots that can be used as multiphoton photosensitizers in the compositions of the invention include those that have at least one electronic excited state that is accessible by absorption (preferably, simultaneous absorption) of two or more photons. Preferably, the quantum dots are substantially soluble (thus, substantially non-agglomerated) in the reactive species. Preferred nanoparticle quantum dots generally exhibit solubility in the reactive species that is greater than about 1.0 percent by weight (preferably, greater than about 2.0 percent; more preferably, greater than about 5.0 percent), based upon the total weight of all components of the photoreactive composition. The nanoparticle quantum dots are preferably sufficiently soluble in the reactive species that the photoreactive composition is optically clear when viewed by the human eye.

Suitable nanoparticle quantum dots generally range in average diameter between about 1 nm and about 50 nm. Preferably, the nanoparticle quantum dots have an average diameter of at least about 1.5 nm; more preferably, at least about 2 nm. The nanoparticle quantum dots are preferably no greater than about 30 nm in average diameter; more preferably, no greater than about 10 nm. Nanoparticle quantum dots having a fairly narrow size distribution are preferred in order to avoid competitive one-photon absorption.

The nanoparticle quantum dots can comprise one or more semiconductor materials. Useful semiconductor materials include, for example, Group II-VI semiconductors (for example, ZnS, ZnSe, ZnTe, CdS, CdSe, CdTe, HgS, HgSe, HgTe, MgTe, and the like), Group III-V semiconductors (for example, GaN, GaP, GaAs, GaSb, InN, InP, InAs, InSb, AlAs, AlP, AlSb, AlS, and the like), Group IV semiconductors (for example, Ge, Si, and the like), Group I-VII semiconductors (for example, CuCl and the like), alloys thereof, and mixtures thereof (for example, ternary and quaternary mixtures). Preferred semiconductor nanoparticle quantum dots comprise a Group IV or a Group II-VI semiconductor (more preferably, a Group II-VI semiconductor; most preferably, a Group II-VI semiconductor comprising zinc or cadmium).

Useful semiconductor nanoparticle quantum dots include preferred nanocrystals that have radii less than or equal to the bulk exciton Bohr radius of the semiconductor and constitute a class of materials intermediate between molecular and bulk forms of matter. In quantum dots, quantum confinement of both electron and hole in all three dimensions leads to an increase in the effective band gap of the semiconductor with decreasing particle size. Consequently, both the absorption edge and the emission wavelength of the particles shift to higher energies (with a corresponding decrease in electron affinity and increase in ionization potential) as the particle size gets smaller. This effect can be used to adjust the effective oxidation and reduction potentials of the particle (see, for example, Brus, *J. Phys. Chem.*, 79:5566 (1983)) and to tune the particle's emission wavelengths to match the absorption bands of other components of the photoinitiator system.

Particularly preferred semiconductor nanoparticle quantum dots comprise a "core" of one or more first semiconductor materials surrounded by a "shell" of a second semiconductor material ("core/shell" semiconductor nanoparticle quantum dots). The surrounding shell material can be chosen to have an atomic spacing close to that of the core material. When enhanced luminescence is desired, the band gaps and band offsets of the core/shell pair can be chosen so that it is energetically favorable for both electron and hole to reside in the core material. When enhanced probability of charge separation of the electron-hole pair is desired, the band gaps and band offsets of the core/shell pair can be chosen so that it is energetically favorable for the electron to reside in the shell and the hole to reside in the core, or vice versa.

Preferably, at least a portion of the surface of the semiconductor nanoparticle quantum dots (hereinafter, semiconductor nanoparticles or simply nanoparticles) is modified so as to aid in the compatibility and dispersibility of the nanoparticles in the reactive species. This surface modification can be effected by various different methods that are known in the art. (See, for example, the surface modification techniques described by Bruchez et al. in Science 281, 2013 (1998) and by Weiss et al. in U.S. Pat. No. 5,990,479, which descriptions are incorporated herein by reference.)

In general, suitable surface treatment agents comprise at least one moiety that is selected to provide solubility in the reactive species (a solubilizing or stabilizing moiety) and at least one moiety that has an affinity for the semiconductor surface (a linking moiety). Suitable linking moieties include those that comprise at least one electron pair that is available for interaction with the semiconductor surface (for example, moieties comprising oxygen, sulfur, nitrogen, or phosphorus). Examples of surface treatment agents comprising such linking moieties include amines, thiols, phosphines, amine oxides, phosphine oxides, and the like. Such linking moieties attach to the semiconductor surface primarily through coordinate bonding of the lone electron pairs of the nitrogen, sulfur, oxygen, or phosphorus atom of the linking group. However, surface treatment agents comprising linking moieties that can attach to the surface of the nanoparticles through other types of chemical bonding (for example, covalent bonding or ionic bonding) or through physical interaction can also be used, as stated above.

Surface treatment agent(s) are perferably used in an amount such that at least a portion of the surface of the nanoparticles is modified sufficiently to render the nanoparticles substantially soluble in the reactive species. The resulting nanoparticles have surface-attached or surface-bonded organic groups.

Surface modification through reaction of surface atoms of the nanoparticles with organic passivating ligands not only enhances the solubility of the nanoparticles in the reactive species but also further serves to eliminate energy levels at the surface of the nanoparticle that lie within the energetically forbidden gap of the core. These surface energy states act as traps for electrons and holes that can degrade the luminescence properties of the semiconductor material.

Semiconductor nanoparticles (for example, monoelement semiconductors such as silicon or germanium and compound semiconductors such as GaAs, InP, CdSe, or ZnS) can be synthesized using a wet chemical process based on standard colloidal chemistry. The general synthesis involves the rapid addition (for example, by injection) of molecular precursors of the semiconductor (for example, $Cd(CH_3)_2$ and $(TMS)_2Se$ for CdSe) into a hot coordinating solvent (for example, an amine or phosphine) that can serve to control growth and prevent aggregation of the nanoparticles (see, for example, Murray et al., *J. Am. Chem. Soc.*115: 8706 (1993)). In view of the highly reactive nature of the precursors and/or to prevent or minimize oxidation of the growing nanoparticles, the synthesis is generally carried out in an inert atmosphere (for example, a nitrogen atmosphere).

An initially high concentration of precursors in solution generally results in the formation of monodisperse seed nuclei of the semiconductor. As the precursor concentration drops below the nucleation threshold, the nanoparticles grow by deposition of remnant material onto the surface. As the precursors are depleted from solution, further growth can be achieved by Ostwald ripening (larger nanoparticles grow while the smaller nanoparticles dissolve; this can be expedited by increasing the temperature) or by further addition of molecular precursors (see, for example, Peng et al., *J. Am Chem. Soc.* 120:5343 (1998)). Nanoparticles of a particular size can be obtained by stopping the growth process by discontinuing the addition of heat.

The resulting nanoparticles can be isolated and purified by precipitation using a non-solvent. The nanoparticles can then be re-dispersed in a variety of solvents and matrices (for example, polymers), depending upon the type of surface treatment agent (if any) used in the synthesis. When a surface treatment agent has been utilized, the resulting surface-attached or surface-bonded groups can be partially or fully replaced with different groups, if desired, by introducing the semiconductor nanoparticles into a medium containing a different surface treatment agent (for example, a neat liquid surface treatment agent or a concentrated surface treatment agent solution).

Core/shell nanoparticles can be synthesized, for example, by following general methods developed by Hines et al. (*J. Phys. Chem.* 100:468 (1996)) and Dabbousi et. al. (*J. Phys. Chem* B 101:9463 (1997)). Growth of core/shell nanoparticles can be accomplished by introducing semiconductor nanoparticle cores (comprising a first semiconductor material) and precursors capable of thermal conversion into a second semiconductor material into a coordinating solvent. The coordinating solvent can be maintained at a temperature sufficient to convert the precursors into the second semiconductor material, yet insufficient to cause significant growth of the semiconductor nanoparticle cores. A shell of the second semiconductor material generally forms on the cores of the first semiconductor material. The thickness of the shell can be controlled by adjusting the quantity of precursors capable of thermal conversion into the second semiconductor material. Particles passivated with such an inorganic shell are generally somewhat more robust than organically-passivated particles and generally have somewhat greater tolerance to the processing conditions used for their incorporation into various media (such as the reactive species used in the photoreactive composition of the invention).

Other methods for preparing suitable semiconductor nanoparticles include those described, for example, by Murray et al. in J. Am. Chem. Soc. 115, 8706 (1993); Katari et al. in J. Phys. Chem. 98, 4109 (1994); Peng et al. in Chem. Eur. J. 8 (#2), 335 (2002) and the references therein; Henglein et al. in Chem. Rev. 89, 1861 (1989); Steigerwald et al. in J. Am Chem. Soc. 111, 4141 (1989); Harrison et al. in Adv. Mater. 12 (#2), 123 (2000); Dabbousi et al. in J. Phys. Chem. 101, 9463 (1997); Peng et al. in J. Am. Chem. Soc. 119, 7019 (1997); Hines et al. in J. Phys. Chem. 100, 468 (1996); Revaprasadu et al. in Chem. Comm. 1573 (1999); Hines et al. in J. Phys. Chem. B 102, 3655 (1998); Nikesh et al. in Semicond. Sci. Technol. 16, 687 (2001); Micic et al. in J. Lum. 70, 95 (1996); Alivisatos et al. in U.S. Pat. No. 5,505,928; Micic at al. in A. P. L. 75 (#4), 478 (1999); Guzelian et al. in J. Phys Chem. 100, 7212 (1996); Micic et al. in J. Phys. Chem. 99, 7754 (1995); Guzelian et al. in A. P. L. 69 (#10), 1432 (1996); Littau et al. in J. Phys. Chem. 97, 1224 (1993); and Holmes et al. in J. Am. Chem. Soc. 123, 3743 (2001); the descriptions of which are incorporated herein by reference.

Other Components of Photoinitiator System

The composition that is capable of interacting with the semiconductor nanoparticles to form at least one reaction-initiating species can be a one-component, a two-component, or a three-component system. One suitable one-component system comprises a photochemically effective amount of at least one one-photon photoinitiator that has an electronic absorption band that overlaps with an up-converted electronic emission band of the semiconductor nanoparticle (that is, a compound that is capable of absorbing the light emitted by the semiconductor nanoparticle and generating a reaction-initiating species). Examples of such compounds include free radical photoinitiators that generate a free radical source and cationic photoinitiators that generate an acid (including either protic or Lewis acids) when exposed to radiation having a wavelength in the ultraviolet or visible portion of the electromagnetic spectrum.

Useful free-radical photoinitiators include acetophenones, benzophenones, aryl glyoxalates, acylphosphine oxides, benzoin ethers, benzil ketals, thioxanthones, chloroalkyltriazines, bisimidazoles, triacylimidazoles, pyrylium compounds, sulfonium and iodonium salts, mercapto componds, quinones, azo compounds, organic peroxides, and mixtures thereof. Examples of such photoinitiators are described, for example, in U.S. Pat. No. 4,735,632 (see column 3, line 26–47), and U.S. Pat. No. 6,054,007 (see column 16, line 58, through column 17, line 7), which descriptions are incorporated herein by reference.

Useful cationic photoinitiators include metallocene salts having an onium cation and a halogen-containing complex anion of a metal or metalloid. Other useful cationic photoinitiators include iodonium salts and sulfonium salts, as well as metallocene salts having an organometallic complex cation and a halogen-containing complex anion of a metal or metalloid (as further described, for example, in U.S. Pat. Nos. 4,751,138 (see, for example, column 6, line 65, through column 9, line 45) and U.S. Pat. No. 5,238,744 (see column 10, line 12, through column 11, line 3), which descriptions are incorporated herein by reference). Mixtures of photoinitiators are also useful.

Such free-radical photoinitiators and cationic photoinitiators and methods for their preparation are known in the art. Many are commercially available.

Other suitable one-component systems comprise an electron donor compound or, alternatively, an electron acceptor compound. One suitable two-component system comprises both an electron donor compound and an electron acceptor compound.

Other useful two-component and three-component systems comprise photochemically effective amounts of (1) at least one one-photon photosensitizer having an electronic absorption band that overlaps with an up-converted electronic emission band of the semiconductor nanoparticle; and (2) either or both of (i) at least one electron donor compound different from the one-photon photosensitizer and capable of donating an electron to an electronic excited state of the one-photon photosensitizer (preferably, an electron donor compound having an oxidation potential that is greater than zero and less than or equal to that of p-dimethoxybenzene); and (ii) at least one photoinitiator or electron acceptor compound that is capable of being photosensitized by accepting an electron from an electronic excited state of the one-photon photosensitizer, resulting in the formation of at least one free radical and/or acid (preferably, a photoinitiator selected from the group consisting of iodonium salts, sulfonium salts, diazonium salts, azinium salts, chloromethylated triazines, and triarylimidazolyl dimers).

(1) One-Photon Photosensitizers

One-photon photosensitizers suitable for use in the photoinitiator system of the photoreactive compositions are those having at least one electronic absorption band that overlaps with at least one up-converted electronic emission band of the semiconductor nanoparticle. Thus, the selection of a one-photon photosensitizer will depend to some extent upon the particular type of semiconductor nanoparticle that is utilized. The spectral overlap of the nanoparticle emission and the photosensitizer absorption can be fine-tuned by adjusting the size of the nanoparticle. However, the one-photon photosensitizer is preferably capable of light absorption somewhere within the range of wavelengths between about 250 and about 800 nanometers (more preferably, between about 350 and about 700 nanometers; and, most preferably, between about 350 and about 600 nanometers), as preferred semiconductor nanoparticles generally emit light of such wavelengths.

Preferably, the one-photon photosensitizer is substantially free of functionalities that would substantially interfere with the reaction of the reactive species, is soluble in the reactive species (if the reactive species is liquid) or is compatible with the reactive species and with any binders (as described below) that are included in the composition, and has a large one-photon absorption coefficient (greater than about 100 $M^{-1}cm^{-1}$) at the emission maximum of the semiconductor nanoparticle. It is also preferred that the one-photon photosensitizer have substantially no one-photon absorption at the wavelength of irradiation. Most preferably, the one-photon photosensitizer is also capable of sensitizing 2-methyl-4,6-bis(trichloromethyl)-s-triazine under continuous irradiation in a wavelength range that overlaps the single photon absorption spectrum of the one-photon photosensitizer (single photon absorption conditions), using the test procedure described in U.S. Pat. No. 3,729,313. Using currently available materials, that test can be carried out as follows:

A standard test solution can be prepared having the following composition: 5.0 parts of a 5% (weight by volume) solution in methanol of 45,000–55,000 molecular weight, 9.0–13.0% hydroxyl content polyvinyl butyral (Butvar™ B76, Monsanto); 0.3 parts trimethylolpropane trimethacrylate; and 0.03 parts 2-methyl-4,6-bis(trichloromethyl)-s-triazine (see Bull. Chem. Soc. Japan, 42, 2924–2930 (1969)). To this solution can be added 0.01 parts of the compound to be tested as a photosensitizer. The resulting solution can then be knife-coated onto a 0.05 mm clear polyester film using a knife orifice of 0.05 mm, and the coating can be air dried for about 30 minutes. A 0.05 mm clear polyester cover film can be carefully placed over the dried but soft and tacky coating with minimum entrapment of air. The resulting sandwich construction can then be exposed for three minutes to 161,000 Lux of incident light from a tungsten light source providing light in both the visible and ultraviolet range (FCH™ 650 watt quartz-iodine lamp, General Electric). Exposure can be made through a stencil so as to provide exposed and unexposed areas in the construction. After exposure the cover film can be removed, and the coating can be treated with a finely divided colored powder, such as a color toner powder of the type conventionally used in xerography. If the tested compound is a photosensitizer, the trimethylolpropane trimethacrylate monomer will be polymerized in the light-exposed areas by the light-generated free radicals from the 2-methyl-4,6-bis(trichloromethyl)-s-triazine. Since the polymerized areas will be essentially tack-free, the colored powder will selectively adhere essentially only to the tacky, unexposed areas of the coating, providing a visual image corresponding to that in the stencil.

Preferably, a one-photon photosensitizer can also be selected based in part upon shelf stability considerations. Accordingly, selection of a particular photosensitizer can depend to some extent upon the particular reactive species utilized (as well as upon the choices of electron donor compound and/or photoinitiator).

Suitable one-photon photosensitizers are believed to include compounds in the following categories: ketones, coumarin dyes (for example, ketocoumarins), xanthene dyes, acridine dyes, thiazole dyes, thiazine dyes, oxazine dyes, azine dyes, aminoketone dyes, porphyrins, aromatic polycyclic hydrocarbons, p-substituted aminostyryl ketone compounds, aminotriaryl methanes, merocyanines, squarylium dyes, cyanine dyes, and pyridinium dyes. Xanthene dyes, cyanine dyes, ketones (for example, monoketones or alpha-diketones), ketocoumarins, aminoarylketones, and p-substituted aminostyryl ketone compounds are preferred one-photon photosensitizers. Mixtures of photosensitizers can also be utilized. For applications requiring high sensitivity, it is generally preferred to employ a one-photon photosensitizer containing a julolidinyl moiety.

A preferred class of ketone photosensitizers comprises those represented by the following general formula:

where X is CO or $CR^1R^2$, where $R^1$ and $R^2$ can be the same or different and can be hydrogen, alkyl, alkaryl, or aralkyl; b is zero; and A and B can be the same or different and can be substituted (having one or more non-interfering substituents) or unsubstituted aryl, alkyl, alkaryl, or aralkyl groups, or together A and B can form a cyclic structure that can be a substituted or unsubstituted alicyclic, aromatic, heteroaromatic, or fused aromatic ring.

Suitable ketones of the above formula include monoketones (b=0) such as 2,2-, 4,4-, or 2,4-dihydroxybenzophenone, di-2-pyridyl ketone, di-2-furanyl ketone, di-2-thiophenyl ketone, benzoin, fluorenone, chalcone, Michler's ketone, 2-fluoro-9-fluorenone, 2-chlorothioxanthone, acetophenone, benzophenone, 1- or 2-acetonaphthone, 9-acetylanthracene, 2-, 3- or 9-acetylphenanthrene, 4-acetylbiphenyl, propiophenone, n-butyrophenone, valerophenone, 2-, 3- or 4-acetylpyridine, 3-acetylcoumarin, and the like. Suitable diketones include aralkyldiketones such as anthraquinone, phenanthrenequinone, o-, m- and p-diacetylbenzene, 1,3-, 1,4-, 1,5-, 1,6-, 1,7- and 1,8-diacetylnaphthalene, 1,5-, 1,8- and 9,10-diacetylanthracene, and the like. Suitable alpha-diketones (b=1 and x=CO) include 2,3-butanedione, 2,3- pentanedione, 2,3-hexanedione, 3,4-hexanedione, 2,3-heptanedione, 3,4-heptanedione, 2,3-octanedione, 4,5-octanedione, benzil, 2,2'- 3,3'- and 4,4'-dihydroxylbenzil, furil, di-3,3'-indolylethanedione, 2,3-bornanedione (camphorquinone), biacetyl, 1,2-cyclohexanedione, 1,2-naphthaquinone, acenaphthaquinone, and the like.

Preferred ketocoumarins and p-substituted aminostyryl ketone compounds include 3-(p-dimethylaminocinnamoyl)-7-dimethyl-aminocoumarin, 3-(p-dimethylaminocinnamoyl)-7-dimethyl-aminocoumarin, 3-(p-diethylaminocinnamoyl)-7-dimethyl-aminocoumarin, 3-(p-diethylaminocinnamoyl)-7-dimethyl-aminocoumarin, 9'-julolidine-4-piperidinoacetophenone, 9'-julolidine-4-piperidinoacetophenone, 9-(4-diethylaminocinnamoyl)-1,2,4,5-tetrahydro-3H,6H, 10H[1]benzopyrano[6,7,8-i,j]quinolizine-10-one, 9-(4-diethylaminocinnamoyl)- 1,2,4,5-tetrahydro-3H,6H, 10H[1]benzopyrano[6,7,8-i,j]quinolizine-10-one, 9-(4-dicyanoethylaminocinnamoyl)-1,2,4,5-tetra-hydro-3H,6H, 10H[1]benzopyrano[6,7,8-i,j]-quinolizine-10-one, 9-(4-dicyanoethylaminocinnamoyl)-1,2,4,5-tetra-hydro-3H,6H, 10H[1]benzopyrano[6,7,8-i,j]-quinolizine-10-one, 2,3-bis(9'-julolidine)cyclopentanone, 2,3-bis(9'-julolidine)cyclopentanone, 9-ethoxycarbonyl-1,2,4,5-tetrahydro-3H,6H, 10H-[1]benzopyrano[6,7,8-i,j]quinolizine-10-one, 9-ethoxycarbonyl-1,2,4,5-tetrahydro-3H,6H, 10H-[1]benzopyrano[6,7,8-i,j]quinolizine-10-one, 2-(4'-diethylaminobenzylidine)-1-indanone, 2-(4'-diethylaminobenzylidine)-1-indanone, 9-acetyl-1,2,4,5-tetrahydro-3H,6H, 10H[1]benzo-pyrano[6,7,8-i,j]quinolizine-10-one, 9-acetyl-1,2,4,5-tetrahydro-3H,6H, 10H[1]benzopyrano[6,7,8-i,j]quinolizine-10-one, 5,10-diethoxy-12,16,17-trichloroviolanthrene, and 5,10-diethoxy-12,16,17-trichloroviolanthrene, and the like.

Particularly preferred one-photon photosensitizers include rose bengal (that is, 4,5,6,7-tetrachloro-2',4',5',7'-tetraiodo fluorescein disodium salt (CAS 632-69-9)), 3-methyl- 2-[(1E,3E)-3-(3-methyl-1,3-benzothiazol-2(3H)-ylidene)prop-1-enyl]-1,3-benzothiazol-3-ium iodide, camphorquinone, glyoxal, biacetyl, 3,3,6,6-tetramethylcyclohexanedione, 3,3,7,7-tetramethyl-1,2-cycloheptanedione, 3,3,8,8-tetramethyl-1,2-cyclooctanedione, 3,3,18,18-tetramethyl-1,2-cyclooctadecanedione, dipivaloyl, benzil, furil, hydroxybenzil, 2,3-butanedione, 2,3-pentanedione, 2,3-hexanedione, 3,4-hexanedione, 2,3-heptanedione, 3,4-heptanedione, 2,3-octanedione, 4,5-octanedione, and 1,2-cyclohexanedione.

(2) Electron Donor Compounds

Electron donor compounds useful in the photoinitiator system of the photoreactive compositions are those compounds (other than the one-photon photosensitizer itself) that are capable of donating an electron to an electronic excited state of the one-photon photosensitizer or to an electronic excited state of the semiconductor nanoparticle. Such compounds may be used, optionally, to provide increased multiphoton photosensitivity, thereby reducing the exposure required to effect photoreaction of the photoreactive composition. The electron donor compounds preferably have an oxidation potential that is greater than zero and less than or equal to that of p-dimethoxybenzene. Preferably, the oxidation potential is between about 0.3 and 2 volts vs. a standard saturated calomel electrode ("S.C.E.").

The electron donor compound is also preferably soluble in the reactive species and is selected based in part upon shelf stability considerations (as described above). Suitable donors are generally capable of increasing the speed of cure or the image density of a photoreactive composition upon exposure to light of the desired wavelength and preferably do not catalyze undesirable side reactions with the semiconductor particles.

When working with cationically-reactive species, those skilled in the art will recognize that the electron donor compound, if of significant basicity, can adversely affect the cationic reaction. (See, for example, the discussion in U.S. Pat. No. 6,025,406 (Oxman et al.) at column 7, line 62, through column 8, line 49.) This caveat can also apply to the choice of semiconductor particle and/or surface treatment agent.

In general, electron donor compounds suitable for use with particular one-photon photosensitizers, semiconductor nanoparticles, and photoinitiators can be selected by comparing the oxidation and reduction potentials of the three components (as described, for example, in U.S. Pat. No. 4,859,572 (Farid et al.)). Such potentials can be measured experimentally (for example, by the methods described by R. J. Cox, *Photographic Sensitivity*, Chapter 15, Academic Press (1973)) or can be obtained from references such as N. L. Weinburg, Ed., *Technique of Electroorganic Synthesis Part II Techniques of Chemistry*, Vol. V (1975), and C. K. Mann and K. K. Barnes, *Electrochemical Reactions in Non-aqueous Systems* (1970). The potentials reflect relative energy relationships and can be used in the following manner to guide electron donor compound selection:

When the one-photon photosensitizer or semiconductor nanoparticle is in an electronic excited state, an electron in the highest occupied molecular orbital (HOMO) of the one-photon photosensitizer or semiconductor nanoparticle has been lifted to a higher energy level (namely, the lowest unoccupied molecular orbital (LUMO) of the one-photon photosensitizer or semiconductor nanoparticle), and a vacancy is left behind in the molecular orbital it initially occupied. The photoinitiator can accept the electron from the higher energy orbital, and the electron donor compound can donate an electron to fill the vacancy in the originally occupied orbital, provided that certain relative energy relationships are satisfied.

If the reduction potential of the photoinitiator is less negative (or more positive) than that of the one-photon photosensitizer or semiconductor nanoparticle, an electron in the higher energy orbital of the one-photon photosensitizer or semiconductor nanoparticle is readily transferred from the one-photon photosensitizer or semiconductor nanoparticle to the lowest unoccupied molecular orbital (LUMO) of the photoinitiator, since this represents an exothermic process. Even if the process is instead slightly endothermic (that is, even if the reduction potential of the one-photon photosensitizer or semiconductor nanoparticle is up to 0.1 volt more negative than that of the photoinitiator) ambient thermal activation can readily overcome such a small barrier.

In an analogous manner, if the oxidation potential of the electron donor compound is less positive (or more negative) than that of the one-photon photosensitizer or semiconductor nanoparticle, an electron moving from the HOMO of the electron donor compound to the orbital vacancy in the one-photon photosensitizer or semiconductor nanoparticle is moving from a higher to a lower potential, which again represents an exothermic process. Even if the process is slightly endothermic (that is, even if the oxidation potential of the one-photon photosensitizer or semiconductor nanoparticle is up to 0.1 volt more positive than that of the electron donor compound), ambient thermal activation can readily overcome such a small barrier.

Slightly endothermic reactions in which the reduction potential of the one-photon photosensitizer or semiconductor nanoparticle is up to 0.1 volt more negative than that of the photoinitiator, or the oxidation potential of the one-photon photosensitizer or semiconductor nanoparticle is up to 0.1 volt more positive than that of the electron donor compound, occur in every instance, regardless of whether the photoinitiator or the electron donor compound first reacts with the one-photon photosensitizer or semiconductor nanoparticle in its excited state. When the photoinitiator or the electron donor compound is reacting with the one-photon photosensitizer or semiconductor nanoparticle in its excited state, it is preferred that the reaction be exothermic or only slightly endothermic. When the photoinitiator or the electron donor compound is reacting with the one-photon photosensitizer ion radical, exothermic reactions are still preferred, but still more endothermic reactions can be expected in many instances to occur. Thus, the reduction potential of the one-photon photosensitizer or semiconductor nanoparticle can be up to 0.2 volt (or more) more negative than that of a second-to-react photoinitiator, or the oxidation potential of the one-photon photosensitizer or semiconductor nanoparticle can be up to 0.2 volt (or more) more positive than that of a second-to-react electron donor compound.

Suitable electron donor compounds include, for example, those described by D. F. Eaton in *Advances in Photochemistry*, edited by B. Voman et al., Volume 13, pp. 427–488, John Wiley and Sons, New York (1986); by Oxman et al. in U.S. Pat. No. 6,025,406 at column 7, lines 42–61; and by Palazzotto et al. in U.S. Pat. No. 5,545,676 at column 4, line 14 through column 5, line 18. Such electron donor compounds include amines (including triethanolamine, hydrazine, 1,4-diazabicyclo[2.2.2]octane, triphenylamine (and its triphenylphosphine and triphenylarsine analogs), aminoaldehydes, and aminosilanes), amides (including phosphoramides), ethers (including thioethers), ureas (including thioureas), sulfinic acids and their salts, salts of ferrocyanide, ascorbic acid and its salts, dithiocarbamic acid and its salts, salts of xanthates, salts of ethylene diamine tetraacetic acid, salts of (alkyl)$_n$(aryl)$_m$borates (n+m=4) (tetraalkylammonium salts preferred), various organometallic compounds such as SnR$_4$ compounds (where each R is independently chosen from among alkyl, aralkyl (particularly, benzyl), aryl, and alkaryl groups) (for example, such compounds as n-C$_3$H$_7$Sn(CH$_3$)$_3$, (allyl)Sn(CH$_3$)$_3$, and (benzyl)Sn(n-C$_3$H$_7$)$_3$), ferrocene, and the like, and mixtures thereof. The electron donor compound can be unsubstituted or can be substituted with one or more non-interfering substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom.

Preferred amine electron donor compounds include alkyl-, aryl-, alkaryl- and aralkyl-amines (for example, methylamine, ethylamine, propylamine, butylamine, triethanolamine, amylamine, hexylamine, 2,4-dimethylaniline, 2,3-dimethylaniline, o-, m- and p-toluidine, benzylamine, aminopyridine, N,N'-dimethylethylenediamine, N,N'-diethylethylenediamine, N,N'-dibenzylethylenediamine, N,N'-diethyl-1,3-propanediamine, N,N'-diethyl-2-butene-1,4-diamine, N,N'-dimethyl-1,6-hexanediamine, piperazine, 4,4'-trimethylenedipiperidine, 4,4'-ethylenedipiperidine, p-N,N-dimethyl-aminophenethanol and p-N-dimethylaminobenzonitrile); aminoaldehydes (for example, p-N,N-dimethylaminobenzaldehyde, p-N,N-diethylaminobenzaldehyde, 9-julolidine carboxaldehyde, and 4-morpholinobenzaldehyde); and aminosilanes (for example, trimethylsilylmorpholine, trimethylsilylpiperidine, bis(dimethylamino)diphenylsilane, tris(dimethylamino)methylsilane, N,N-diethylaminotrimethylsilane, tris(dimethylamino)phenylsilane, tris(methylsilyl)aamine, tris(dimethylsilyl)amine, bis(dimethylsilyl)amine, N,N-bis(dimethylsilyl)aniline, N-phenyl-N-dimethylsilylaniline, and N,N-dimethyl-N-dimethylsilylamine); and mixtures thereof. Tertiary aromatic alkylamines, particularly those having at least one electron-withdrawing group on the aromatic ring, have been found to provide especially good shelf stability.

Preferred amide electron donor compounds include N,N-dimethylacetamide, N,N-diethylacetamide, N-methyl-N-phenylacetamide, hexamethylphosphoramide, hexaethylphosphoramide, hexapropylphosphoramide, trimorpholinophosphine oxide, tripiperidinophosphine oxide, and mixtures thereof.

Preferred alkylarylborate salts include
$Ar_3B(n-C_4H_9)^-N(C_2H_5)_4^+$
$Ar_3B(n-C_4H_9)^-N(CH_3)_4^+$
$Ar_3B(n-C_4H_9)^-N(n-C_4H_9)_4^+$
$Ar_3B(n-C_4H_9)^-Li^+$
$Ar_3B(n-C_4H_9)^-N(C_6H_{13})_4^+$
$Ar_3B(C_4H_9)^-N(CH_3)_3(CH_2)_2CO_2(CH_2)_2CH_3^+$
$Ar_3B(C_4H_9)^-N(CH_3)_3(CH_2)_2OCO(CH_2)_2CH_3^+$
$Ar_3B(sec-C_4H_9)^-N(CH_3)_3(CH_2)_2CO_2(CH_2)_2CH_3^+$
$Ar_3B(sec-C_4H_9)^-N(C_6H_{13})_4^+$
$Ar_3B(C_4H_9)^-N(C_8H_{17})_4^+$
$Ar_3B(C_4H_9)^-N(CH_3)_4^+$
$(p-CH_3O-C_6H_4)_3B(n-C_4H_9)^-N(n-C_4H_9)_4^+$
$Ar_3B(C_4H_9)^-N(CH_3)_3(CH_2)_2OH^+$
$ArB(n-C_4H_9)_3^-N(CH_3)_4^+$
$ArB(C_2H_5)_3^-N(CH_3)_4^+$
$Ar_2B(n-C_4H_9)_2^-N(CH_3)_4^+$
$Ar_3B(C_4H_9)^-N(C_4H_9)_4^+$
$Ar_4B^-N(C_4H_9)_4^+$
$ArB(CH_3)_3^-N(CH_3)_4^+$
$(n-C_4H_9)_4B^-N(CH_3)_4^+$
$Ar_3B(C_4H_9)^-P(C_4H_9)_4^+$
(where Ar is phenyl, naphthyl, substituted (preferably, fluoro-substituted) phenyl, substituted naphthyl, and like groups having greater numbers of fused aromatic rings), as well as tetramethylammonium n-butyltriphenylborate and tetrabutylammonium n-hexyl-tris(3-fluorophenyl)borate (available as CGI 437 and CGI 746 from Ciba Specialty Chemicals Corporation), and mixtures thereof.

Suitable ether electron donor compounds include 4,4'-dimethoxybiphenyl, 1,2,4-trimethoxybenzene, 1,2,4,5-tetramethoxybenzene, and the like, and mixtures thereof. Suitable urea electron donor compounds include N,N'-dimethylurea, N,N-dimethylurea, N,N'-diphenylurea, tetramethylthiourea, tetraethylthiourea, tetra-n-butylthiourea, N,N-di-n-butylthiourea, N,N'-di-n-butylthiourea, N,N-diphenylthiourea, N,N'-diphenyl-N,N'-diethylthiourea, and the like, and mixtures thereof.

Preferred electron donor compounds for free radical-induced reactions include amines that contain one or more julolidinyl moieties, alkylarylborate salts, and salts of aromatic sulfinic acids. However, for such reactions, the electron donor compound can also be omitted, if desired (for example, to improve the shelf stability of the photoreactive composition or to modify resolution, contrast, and reciprocity). Preferred electron donor compounds for acid-induced reactions include 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, and 1,2,4-trimethoxybenzene.

(3) Photoinitiators for Two-Component and Three-Component Systems

Suitable photoinitiators (that is, electron acceptor compounds) for the reactive species of the photoreactive compositions include those that are capable of being photosensitized by accepting an electron from an electronic excited state of the one-photon photosensitizer or semiconductor nanoparticle, resulting in the formation of at least one free radical and/or acid. Such photoinitiators include iodonium salts (for example, diaryliodonium salts), chloromethylated triazines (for example, 2-methyl-4,6-bis (trichloromethyl)-s-triazine, 2,4,6-tris(trichloromethyl)-s-triazine, and 2-aryl-4,6-bis(trichloromethyl)-s-triazine), diazonium salts (for example, phenyldiazonium salts optionally substituted with groups such as alkyl, alkoxy, halo, or nitro), sulfonium salts (for example, triarylsulfonium salts optionally substituted with alkyl or alkoxy groups, and optionally having 2,2' oxy groups bridging adjacent aryl moieties), azinium salts (for example, an N-alkoxypyridinium salt), and triarylimidazolyl dimers (preferably, 2,4,5-triphenylimidazolyl dimers such as 2,2',4, 4',5,5'-tetraphenyl-1,1'-biimidazole, optionally substituted with groups such as alkyl, alkoxy, or halo), and the like, and mixtures thereof.

The photoinitiator is preferably soluble in the reactive species and is preferably shelf-stable (that is, does not spontaneously promote reaction of the reactive species when dissolved therein in the presence of the photosensitizers and the electron donor compound). Accordingly, selection of a particular photoinitiator can depend to some extent upon the particular reactive species, semiconductor nanoparticle, photosensitizer, and electron donor compound chosen, as described above. If the reactive species is capable of undergoing an acid-initiated chemical reaction, then the photoinitiator is an onium salt (for example, an iodonium, sulfonium, or diazonium salt).

Suitable iodonium salts include those described by Palazzotto et al. in U.S. Pat. No. 5,545,676 at column 2, lines 28 through 46. Suitable iodonium salts are also described in U.S. Pat. Nos. 3,729,313, 3,741,769, 3,808,006, 4,250,053 and 4,394,403. The iodonium salt can be a simple salt (for example, containing an anion such as Cl$^-$, Br$^-$, I$^-$ or C$_4$H$_5$SO$_3^-$) or a metal complex salt (for example, containing SbF$_6^-$, PF$_6^-$, BF$_4^-$, tetrakis(perfluorophenyl)borate, SbF$_5$OH$^-$ or AsF$_6^-$). Mixtures of iodonium salts can be used if desired.

Examples of useful aromatic iodonium complex salt photoinitiators include diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl) iodonium hexafluorophosphate; di(4-chlorophenyl) iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl)iodonium hexafluorophosphate; diphenyliodonium hexafluoroarsenate; di(4-phenoxyphenyl) iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl)iodonium hexafluorophosphate; di(4-bromophenyl)iodonium hexafluorophosphate; di(4-methoxyphenyl)iodonium hexafluorophosphate; di(3-carboxyphenyl) iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate; and the like; and mixtures thereof. Aromatic iodonium complex salts can be prepared by metathesis of corresponding aromatic iodonium simple salts (such as, for example, diphenyliodonium bisulfate) in accordance with the teachings of Beringer et al., J. Am. Chem. Soc. 81, 342 (1959).

Preferred iodonium salts include diphenyliodonium salts (such as diphenyliodonium chloride, diphenyliodonium hexafluorophosphate, and diphenyliodonium tetrafluoroborate), diaryliodonium hexafluoroantimonate (for example, SarCat™ CD 1012 obtained from Sartomer Company), and mixtures thereof.

Useful chloromethylated triazines include those described in U.S. Pat. No. 3,779,778 (Smith et al.) at column 8, lines 45–50, which include 2,4-bis(trichloromethyl)-6-methyl-s-triazine, 2,4,6-tris(trichloromethyl)-s-triazine, and the more preferred chromophore-substituted vinylhalomethyl-s-triazines disclosed in U.S. Pat. Nos. 3,987,037 and 3,954, 475 (Bonham et al.).

Useful diazonium salts include those described in U.S. Pat. No. 4,394,433 (Gatzke), which comprise a light sensitive aromatic moiety (for example, pyrrolidine, morpholine, aniline, and diphenyl amine) with an external diazonium group (—N$^+$=N) and an anion (for example, chloride, triisopropyl naphthalene sulfonate, tetrafluoroborate, and the bis(perfluoroalkylsulfonyl)methides) associated therewith. Examples of useful diazonium cations include 1-diazo-4-anilinobenzene, N-(4-diazo-2,4-dimethoxy phenyl) pyrrolidine, 1-diazo-2,4-diethoxy-4-morpholino benzene, 1-diazo-4-benzoyl amino-2,5-diethoxy benzene, 4-diazo-2, 5-dibutoxy phenyl morpholino, 4-diazo-1-dimethyl aniline, 1-diazo-N,N-dimethylaniline, 1-diazo-4-N-methyl-N-hydroxyethyl aniline, and the like.

Useful sulfonium salts include those described in U.S. Pat. No. 4,250,053 (Smith) at column 1, line 66, through column 4, line 2, which can be represented by the formulas:

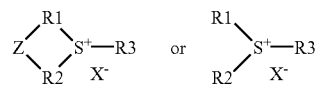

wherein $R_1$, $R_2$, and $R_3$ are each independently selected from aromatic groups having from about 4 to about 20 carbon atoms (for example, substituted or unsubstituted phenyl, naphthyl, thienyl, and furanyl, where substitution can be with such groups as alkoxy, alkylthio, arylthio, halogen, arylsulfonium, and so forth) and alkyl groups having from 1 to about 20 carbon atoms. As used here, the term "alkyl" includes substituted alkyl (for example, substituted with such groups as halogen, hydroxy, alkoxy, or aryl). At least one of $R_1$, $R_2$, and $R_3$ is aromatic, and, preferably, each is independently aromatic. Z is selected from the group consisting of a covalent bond, oxygen, sulfur, —S(=O)—, —C(=O)—, —(O=)S(=O)—, and —N(R)—, where R is aryl (of about 6 to about 20 carbons, such as phenyl), acyl (of about 2 to about 20 carbons, such as acetyl, benzoyl, and so forth), a carbon-to-carbon bond, or —(R$_4$—)C(—R$_5$)—, where R$_4$ and R$_5$ are independently selected from the group consisting of hydrogen, alkyl groups having from 1 to about 4 carbon atoms, and alkenyl groups having from about 2 to about 4 carbon atoms. X$^-$ is an anion, as described below.

Suitable anions, X$^-$, for the sulfonium salts (and for any of the other types of photoinitiators) include a variety of anion types such as, for example, imide, methide, boron-centered, phosphorous-centered, antimony-centered, arsenic-centered, and aluminum-centered anions.

Illustrative, but not limiting, examples of suitable imide and methide anions include $(C_2F_5SO_2)_2N^-$, $(C_4F_9SO_2)_2N^-$, $(C_8F_{17}SO_2)_3C^-$, $(CF_3SO_2)_3C^-$, $(CF_3SO_2)_2N^-$, $(C_4F_9SO_2)_3C^-$, $(CF_3SO_2)_2(C_4F_9SO_2)C^-$, $(CF_3SO_2)(C_4F_9SO_2)N^-$, $((CF_3)_2NC_2F_4SO_2)_2N^-$, $(CF_3)_2NC_2F_4SO_2C^-(SO_2CF_3)_2$, $(3,5\text{-bis}(CF_3)C_6H_3)SO_2N^-SO_2CF_3$, $C_6H_5SO_2C^-(SO_2CF_3)_2$, $C_6H_5SO_2N^-SO_2CF_3$, and the like. Preferred anions of this type include those represented by the formula $(R_fSO_2)_3C^-$, wherein $R_f$ is a perfluoroalkyl radical having from 1 to about 4 carbon atoms.

Illustrative, but not limiting, examples of suitable boron-centered anions include $F_4B^-$, $(3,5\text{-bis}(CF_3)C_6H_3)_4B^-$, $(C_6F_5)_4B^-$, $(p\text{-}CF_3C_6H_4)_4B^-$, $(m\text{-}CF_3C_6H_4)_4B^-$, $(p\text{-}FC_6H_4)_4B^-$, $(C_6F_5)_3(CH_3)B^-$, $(C_6F_5)_3(n\text{-}C_4H_9)B^-$, $(p\text{-}CH_3C_6H_4)_3(C_6F_5)B^-$, $(C_6F_5)_3FB^-$, $(C_6H_5)_3(C_6F_5)B^-$, $(CH_3)_2(p\text{-}CF_3C_6H_4)_2B^-$, $(C_6F_5)_3(n\text{-}C_{18}H_{37}O)B^-$, and the like. Preferred boron-centered anions generally contain 3 or more halogen-substituted aromatic hydrocarbon radicals attached to boron, with fluorine being the most preferred halogen. Illustrative, but not limiting, examples of the preferred anions include $(3,5\text{-bis}(CF_3)C_6H_3)_4B^-$, $(C_6F_5)_4B^-$, $(C_6F_5)_3(n\text{-}C_4H_9)B^-$, $(C_6F_5)_3FB^-$, and $(C_6F_5)_3(CH_3)B^-$.

Suitable anions containing other metal or metalloid centers include, for example, $(3,5\text{-bis}(CF_3)C_6H_3)_4Al^-$, $(C_6F_5)_4Al^-$, $(C_6F_5)_2F_4P^-$, $(C_6F_5)F_5P^-$, $F_6P^-$, $(C_6F_5)F_5Sb^-$, $F_6Sb^-$, $(HO)F_5Sb^-$, and $F_6As^-$. The foregoing lists are not intended to be exhaustive, as other useful boron-centered nonnucleophilic salts, as well as other useful anions containing other metals or metalloids, will be readily apparent (from the foregoing general formulas) to those skilled in the art.

Preferably, the anion, $X^-$, is selected from tetrafluoroborate, hexafluorophosphate, hexafluoroarsenate, hexafluoroantimonate, and hydroxypentafluoroantimonate (for example, for use with cationically-reactive species such as epoxy resins).

Examples of suitable sulfonium salt photoinitiators include:
triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluorophosphate
tri(4-phenoxyphenyl)sulfonium hexafluorophosphate
di(4-ethoxyphenyl)methylsulfonium hexafluoroarsenate
4-acetonylphenyldiphenylsulfonium tetrafluoroborate
4-thiomethoxyphenyldiphenylsulfonium hexafluorophosphate
di(methoxysulfonylphenyl)methylsulfonium hexafluoroantimonate
di(nitrophenyl)phenylsulfonium hexafluoroantimonate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
p-(phenylthiophenyl)diphenylsulfonium hexafluoroantimonate
p-(phenylthiophenyl)diphenylsulfonium hexafluorophosphate
di-[p-(phenylthiophenyl)]phenylsulfonium hexafluoroantimonate
di-[p-(phenylthiophenyl)]phenylsulfonium hexafluorophosphate
4,4'-bis(diphenylsulfonium)diphenylsulfide bis (hexafluoroantimonate)
4,4'-bis(diphenylsulfonium)diphenylsulfide bis (hexafluorophosphate)
10-methylphenoxathiinium hexafluorophosphate
5-methylthianthrenium hexafluorophosphate
10-phenyl-9,9-dimethylthioxanthenium hexafluorophosphate
10-phenyl-9-oxothioxanthenium tetrafluoroborate
5-methyl-10-oxothianthrenium tetrafluoroborate
5-methyl-10,10-dioxothianthrenium hexafluorophosphate
and mixtures thereof.

Preferred sulfonium salts include triaryl-substituted salts such as mixed triarylsulfonium hexafluoroantimonate (for example, UVI-6974 available from Dow Chemical Company), mixed triarylsulfonium hexafluorophosphate (for example, UVI-6990 available from Dow Chemical Company), and arylsulfonium hexafluorophosphate salt (for example, SarCat™ K185 available from Sartomer Company).

Useful azinium salts include those described in U.S. Pat. No. 4,859,572 (Farid et al.) at column 8, line 51, through column 9, line 46, which include an azinium moiety, such as a pyridinium, diazinium, or triazinium moiety. The azinium moiety can include one or more aromatic rings, typically carbocyclic aromatic rings (for example, quinolinium, isoquinolinium, benzodiazinium, and naphthodiazonium moieties), fused with an azinium ring. A quaternizing substituent of a nitrogen atom in the azinium ring can be released as a free radical upon electron transfer from the electronic excited state of the one-photon photosensitizer to the azinium photoinitiator. In one preferred form, the quaternizing substituent is an oxy substituent. The oxy substituent, —O—T, which quaternizes a ring nitrogen atom of the azinium moiety can be selected from among a variety of synthetically convenient oxy substituents. The moiety T can, for example, be an alkyl radical, such as methyl, ethyl, butyl, and so forth. The alkyl radical can be substituted. For example, aralkyl (for example, benzyl and phenethyl) and sulfoalkyl (for example, sulfomethyl) radicals can be useful. In another form, T can be an acyl radical, such as an —OC(O)—$T^1$ radical, where $T^1$ can be any of the various alkyl and aralkyl radicals described above. In addition, $T^1$ can be an aryl radical, such as phenyl or naphthyl. The aryl radical can in turn be substituted. For example, $T^1$ can be a tolyl or xylyl radical. T typically contains from 1 to about 18 carbon atoms, with alkyl moieties in each instance above preferably being lower alkyl moieties and aryl moieties in each instance preferably containing about 6 to about 10 carbon atoms. Highest activity levels have been realized when the oxy substituent, —O— T, contains 1 or 2 carbon atoms. The azinium nuclei need include no substituent other than the quaternizing substituent. However, the presence of other substituents is not detrimental to the activity of these photoinitiators.

Useful triarylimidazolyl dimers include those described in U.S. Pat. No. 4,963,471 (Trout et al.) at column 8, lines 18–28. These dimers include, for example, 2-(o-chlorophenyl)-4,5-bis(m-methoxyphenyl)-1,1'-biimidazole; 2,2'-bis(o-chlorophenyl)-4,4', 5,5'-tetraphenyl-1,1'-biimidazole; and 2,5-bis(o-chlorophenyl)-4-[3,4-dimethoxyphenyl]-1,1'-biimidazole.

Preferred photoinitiators include iodonium salts (more preferably, aryliodonium salts), chloromethylated triazines, triarylimidazolyl dimers (more preferably, 2,4,5-triphenylimidazolyl dimers), sulfonium salts, and diazonium salts. More preferred are aryliodonium salts, chloromethylated triazines, and the 2,4,5-triphenylimidazolyl dimers (with aryliodonium salts and the triazines being most preferred).

If desired, the photoinitiator, the one-photon photosensitizer, the electron acceptor, and/or the electron donor can be physically or chemically attached (preferably, chemically bonded) to the surface of the semiconductor nanoparticle to enhance the probability of generating a reaction-initiating species. Such attachment can be effected through the use of a tethering agent comprising a linking moiety that does not significantly affect the electronic structure of the photoinitiator, the one-photon photosensitizer, the electron acceptor, the electron donor, and/or the semiconductor nanoparticle. Preferably, the tethering agent comprises at least one tetracoordinate carbon atom. Examples of useful tethering agents include the above-described surface treatment agents and the like, as well as the tethering agents described in U.S. Pat. No. 4,954,416 (Wright et al.), the descriptions of which are incorporated herein by reference.

Preparation of Photoreactive Composition

The reactive species, semiconductor nanoparticles, one-photon photosensitizers, electron donor compounds, and photoinitiators (or electron acceptor compounds) can be prepared by the methods described above or by other methods known in the art, and many are commercially available. These components can be combined under "safe light" conditions using any order and manner of combination (optionally, with stirring or agitation), although it is sometimes preferable (from a shelf life and thermal stability standpoint) to add the photoinitiator last (and after any heating step that is optionally used to facilitate dissolution of other components). It can also be preferable to first add the semiconductor nanoparticles to the highest viscosity components of the photoreactive composition in which the nanoparticles are most soluble, to mix the resulting combination until the nanoparticles are completely dispersed, and then to add the remaining components. Solvent can be used, if desired, provided that the solvent is chosen so as to not react appreciably with the components of the composition. Suitable solvents include, for example, acetone, dichloromethane, and acetonitrile. The reactive species itself can also sometimes serve as a solvent for the other components.

The components of the photoinitiator system are present in photochemically effective amounts (as defined above). Generally, the photoreactive composition can contain at least about 5% (preferably, at least about 10%; more preferably, at least about 20%) up to about 99.79% by weight of one or more reactive species; at least about 0.01% (preferably, at least about 0.1%; more preferably, at least about 0.2%) up to about 10% (preferably, up to about 5%; more preferably, up to about 2%) by weight of semiconductor nanoparticles; and at least about 0.1% (preferably, at least about 0.2%; more preferably, at least about 0.3%) up to about 15% (preferably, up to about 10%; more preferably, up to about 5%) of the composition that is capable of interacting with the semiconductor nanoparticles to form at least one reaction-initiating species.

When the interacting composition includes a one-photon photosensitizer, the photoreactive composition can generally contain at least about 0.01% (preferably, at least about 0.1%; more preferably, at least about 0.2%) up to about 10% (preferably, up to about 5%; more preferably, up to about 2%) by weight of one or more of the one-photon photosensitizers; and either or both of (i) up to about 10% (preferably, up to about 5%) by weight of one or more electron donor compounds (preferably, at least about 0.1%; more preferably, from about 0.1% to about 5%) and (ii) from about 0.1% to about 10% by weight of one or more electron acceptor compounds (preferably, from about 0.1% to about 5%).

When the interacting composition does not include a one-photon photosensitizer, the photoreactive composition can generally contain either or both of (i) from about 0.01% (preferably, at least about 0.1%; more preferably, at least about 0.2%) up to about 10% (preferably, up to about 5%) by weight of one or more electron donor compounds and (ii) from about 0.1% to about 10% by weight of one or more electron acceptor compounds (preferably, from about 0.1% to about 5%); or, alternatively, the photoreactive composition can contain from about 0.01% (preferably, at least about 0.1%; more preferably, at least about 0.2%) up to about 10% (preferably, up to about 5%) by weight of one or more photoinitiator compounds. When the reactive species is a leuco dye, the composition generally can contain from about 0.01% to about 10% by weight of one or more reactive species (preferably, from about 0.3% to about 10%; more preferably, from about 1% to about 10%; most preferably, from about 2% to about 10%). The above-cited percentages are based upon the total weight of solids (that is, the total weight of components other than solvent).

A wide variety of adjuvants can be included in the photoreactive compositions, depending upon the desired end use. Suitable adjuvants include solvents, diluents, resins, binders, plasticizers, pigments, dyes, inorganic or organic reinforcing or extending fillers (at preferred amounts of about 10% to 90% by weight based on the total weight of the composition), thixotropic agents, indicators, inhibitors, stabilizers, ultraviolet absorbers, medicaments (for example, leachable fluorides), and the like. The amounts and types of such adjuvants and their manner of addition to the compositions will be familiar to those skilled in the art.

It is within the scope of this invention to include nonreactive polymeric binders in the compositions in order, for example, to control viscosity and to provide film-forming properties. Such polymeric binders can generally be chosen to be compatible with the reactive species. For example, polymeric binders that are soluble in the same solvent that is used for the reactive species, and that are free of functional groups that can adversely affect the course of reaction of the reactive species, can be utilized. Binders can be of a molecular weight suitable to achieve desired film-forming properties and solution rheology (for example, molecular weights between about 5,000 and 1,000,000 daltons; preferably between about 10,000 and 500,000 daltons; more preferably, between about 15,000 and 250,000 daltons). Suitable polymeric binders include, for example, polystyrene, poly (methyl methacrylate), poly(styrene)-co-(acrylonitrile), cellulose acetate butyrate, and the like.

Prior to exposure, the resulting photoreactive compositions can be coated on a substrate, if desired, by any of a variety of coating methods known to those skilled in the art (including, for example, knife coating and spin coating). The substrate can be chosen from a wide variety of films, sheets, and other surfaces, depending upon the particular application and the method of exposure to be utilized. Preferred substrates are generally sufficiently flat to enable the preparation of a layer of photoreactive composition having a uniform thickness. For applications where coating is less desirable, the photoreactive compositions can alternatively be exposed in bulk form.

Exposure System and Its Use

Useful exposure systems include at least one light source and at least one optical element. Any light source that provides sufficient intensity (to effect multiphoton absorption) at a wavelength appropriate for the selected semiconductor nanoparticles (for example, a wavelength that is matched with a long-wave length visible or near-infrared absorption band of the nanoparticle) can be utilized. Such wavelengths can generally be in the range of about 500 to about 1700 nm; preferably, from about 600 to about 1100 nm; more preferably, from about 750 to about 1000 nm. Illumination can be continuous or pulsed or a combination thereof.

Suitable light sources include, for example, femtosecond near-infrared titanium sapphire oscillators (for example, a Coherent Mira Optima 900-F) pumped by an argon ion laser (for example, a Coherent Innova). This laser, operating at 76 MHz, has a pulse width of less than 200 femtoseconds, is tunable between 700 and 980 nm, and has average power up to 1.4 Watts. Q-switched Nd:YAG lasers (for example, a Spectra-Physics Quanta-Ray PRO), visible wavelength dye lasers (for example, a Spectra-Physics Sirah pumped by a Spectra-Physics Quanta-Ray PRO), and Q-switched diode pumped lasers (for example, a Spectra-Physics FCbar™) can also be utilized. Peak intensities generally are at least about $10^6$ W/cm$^2$. The upper limit of the pulse fluence is generally dictated by the ablation threshold of the photoreactive composition.

Preferred light sources include near-infrared pulsed lasers having a pulse length less than about $10^{-8}$ second (more preferably, less than about $10^{-9}$ second; most preferably, less than about $10^{-11}$ second). Other pulse lengths can be used provided that the above-detailed peak intensity and pulse fluence criteria are met.

Optical elements useful in carrying out the method of the invention include refractive optical elements (for example, lenses and prisms), reflective optical elements (for example, retroreflectors or focusing mirrors), diffractive optical elements (for example, gratings, phase masks, and holograms), polarizing optical elements (for example, linear polarizers and waveplates), diffusers, Pockels cells, waveguides, waveplates, and birefringent liquid crystals, and the like. Such optical elements are useful for focusing, beam delivery, beam/mode shaping, pulse shaping, and pulse timing. Generally, combinations of optical elements can be utilized, and other appropriate combinations will be recognized by those skilled in the art. It is often desirable to use optics with large numerical aperture to provide highly-focused light. However, any combination of optical elements that provides a desired intensity profile (and spatial placement thereof) can be utilized. For example, the exposure system can include a scanning confocal microscope (BioRad MRC600) equipped with a 0.75 NA objective (Zeiss 20×Fluar).

Generally, exposure of the photoreactive composition can be carried out using a light source (as described above) along with an optical system as a means for controlling the three-dimensional spatial distribution of light intensity within the composition. For example, the light from a continuous wave or pulsed laser can be passed through a focusing lens in a manner such that the focal point is within the volume of the composition. The focal point can be scanned or translated in a three-dimensional pattern that corresponds to a desired shape, thereby creating a three-dimensional image of the desired shape. The exposed or illuminated volume of the composition can be scanned either by moving the composition itself or by moving the light source (for example, moving a laser beam using galvo-mirrors). The resulting exposed composition can be subjected to a post-exposure heat treatment, if desired.

If the light induces, for example, a reaction of the reactive species that produces a material having solubility characteristics different from those of the reactive species, the resulting image can optionally be developed by removing either the exposed or the unexposed regions through use of an appropriate solvent, for example, or by other art-known means. Cured, complex, three-dimensional objects can be prepared in this manner.

Exposure times generally depend upon the type of exposure system used to cause image formation (and its accompanying variables such as numerical aperture, geometry of light intensity spatial distribution, the peak light intensity during, for example, the laser pulse (higher intensity and shorter pulse duration roughly correspond to peak light intensity)), as well as upon the nature of the composition exposed (and its concentrations of photosensitizer(s), photoinitiator, and electron donor compound). Generally, higher peak light intensity in the regions of focus allows shorter exposure times, everything else being equal. Linear imaging or "writing" speeds generally can be about 5 to 100,000 microns/second using a continuous wave laser or using a pulsed laser with a laser pulse duration of about $10^{-8}$ to $10^{-15}$ second (preferably, about $10^{-11}$ to $10^{-14}$ second) and about $10^2$ to $10^9$ pulses per second (preferably, about $10^3$ to $10^8$ pulses per second).

EXAMPLES

Objects and advantages of this invention are further illustrated by the following examples, but the particular materials and amounts thereof recited in these examples, as well as other conditions and details, should not be construed to unduly limit this invention.

Example 1

Multiphoton Photopolymerization Using (CdSe)ZnS Nanoparticles

Multiphoton photopolymerization was effected using a photoinitiator system consisting of CdSe nanoparticles, a cyanine dye (one-photon photosensitizer) whose absorption band corresponded with the fluorescence emission band from the CdSe nanoparticles, an electron acceptor, and an electron donor. CdSe nanoparticles were prepared as described below, using a slight modification of the synthesis described in J. Am. Chem. Soc. 115, 8706 (1993). Unless otherwise noted, chemicals were commercially available from Aldrich Chemical Co., Milwaukee, Wis.

Preparation of (CdSe)ZnS Nanoparticles 30 g of tri-n-octyl phosphine oxide (TOPO) (STREM Chemicals, Newburyport, Mass.) was dried under vacuum at 175° C. for 4 hours in a 250 mL, three-neck round bottom flask fitted with a temperature probe, condenser, and septum. The TOPO was then placed under nitrogen and the temperature raised to 350° C. Into this was injected by syringe 16 ml tri-n-octyl phosphine (TOP) (Fluka, Steinheim, Germany), 4 ml of a 1 molar solution of tri-n-octyl phosphine selenide (TOPSe) in TOP and 200 µl of dimethylcadmium (Cd(CH$_3$)$_2$) (STREM Chemicals, Newburyport, Mass.) under vigorous stirring. Nanoparticles were grown until they had a first absorption maximum of 523 nm (indicative of an approximately 3 nm average diameter; see Murray et al., J. Am. Chem. Soc. 115, 8706 (1993)). The growth solution was then cooled and added to 16 ml of butanol. The nanoparticles were then isolated by precipitation with methanol.

The nanoparticles were overcoated with a nominal shell of 4 monolayers (up to about 9.2 Å thickness) of ZnS as follows: 60 g of TOPO were dried under vacuum at 175° C.

for 4 hours in a 250 mL, four-rieck round bottom flask fitted with a condenser, an addition funnel fitted with a septum, a temperature probe, and a septum. To this was added a hexane solution containing 0.4 mmol of CdSe in the form of isolated nanoparticles. The hexane was removed under vacuum at 60° C. and then the reaction vessel was maintained under nitrogen. For overcoating, 20 ml of TOP, 0.166 ml diethyl zinc (Fluka, Steinheim, Germany), and 0.333 ml bis(trimethylsilyl)sulfide (Fluka, Steinheim, Germany) were loaded into a syringe in a drybox. The syringe was then removed from the drybox and its contents injected into an addition funnel fitted with a septum. The solution was then added dropwise to the CdSe/TOPO solution at 155° C. The temperature was then lowered to 90° C., and the resulting solution was stirred overnight. The resulting overcoated nanoparticles were isolated as indicated above and dispersed in toluene.

Preparation of Absorbing Dye

The procedure for synthesis of 3-methyl-2-[(1E,3E)-3-(3-methyl-1,3-benzothiazol-2(3H)-ylidene)prop-1-enyl]-1,3-benzothiazol-3-ium iodide followed generally that outlined in *Biochemistry* 13, 3315(1974). Methylation of 2-methylbenzothiazole was carried out by combining 5 ml of 2-methylbenzothiazole with 2.6 ml of methyliodide in approximately 50 ml of methylene chloride and refluxing overnight. A white solid was produced, the benzothiazolium iodide salt, that was isolated by filtration, yield, 9.67 g. This iodide salt was coupled to form the dye by using triethylorthoformate in refluxing pyridine. The 9.67 g of the iodide salt was combined with 5.8 ml of triethylorthoformate in 20 ml of pyridine and refluxed for approximately 5 hours. The resulting product was isolated by filtration and washed with a cold pyridine/water mixture. The product was dried and a yield of 6.6 g of the desired dye was obtained. Nuclear magnetic resonance spectroscopy (NMR) was used to confirm the structure of the dye.

Preparation of Photoreactive Compositions

A solution of 10.0 mg of 3-methyl-2-[(1E,3E)-3-(3-methyl-1,3-benzothiazol-2(3H)-ylidene)prop-1-enyl]-1,3-benzothiazol-3-ium iodide (henceforth referred to as the cyanine dye) in 2.02 g of a 50/50 mixture of isocyanurate triacrylate (SR368) and an alkoxylated trifunctional acrylate ester (SR9008) (both available from Sartomer Co., West Chester, Pa.) was prepared and allowed to stir overnight. 40.2 mg CD1012 diaryliodonium hexafluoroantimonate salt (available from Sartomer Company,West Chester, Pa.) and 10.8 mg CGI 7460 borate salt (available from Ciba Specialty Chemicals, Tarrytown, N.Y.) were dissolved in 0.11 g tetrahydrofuran and then added to the solution to form Stock Solution A, which was prepared under safe lights and then stored in amber vials to prevent premature gelation.

Stock Solution A was then used to prepare three photoreactive compositions as follows:

Composition B 1.5 mL of a 0.05 M solution of the CdSe nanoparticles in toluene was added to 0.433 g of poly(vinyl butyral) in 0.5 mL of toluene and allowed to stir for 20 minutes until the nanoparticles were completed dispersed. 0.461 g of Stock Solution A was added, and the resulting mixture was stirred for 5 minutes.

Composition C (Comparative)

38.9 mg of 99.999% bulk CdSe (325 mesh, Alfa Aesar, Ward Hill, Mass.) was added to 2.20 g of a 20 wt % solution of poly(vinyl butyral) in toluene and stirred for 20 minutes until well dispersed. 0.439 g of Stock Solution A was added, and the resulting mixture was stirred for 5 minutes.

Composition D (Comparative)

0.531 g of Stock Solution A was added to 2.21 g of a 20 wt. % solution of poly(vinyl butyral) in toluene and stirred for 5 minutes.

The compositions were spun coated at 2500 rpm on to microscope slides treated with trimethyoxysilylpropyl methacrylate to form clear coatings approximately 30 microns thick. Residual solvent was removed by baking the coated slides in an 80° C. oven for 10 minutes. Table 1 summarizes the compositions of the three coatings based on weight of solids.

TABLE 1

Photoreactive Compositions

| Component | Composition B (Wt %) | Composition C (Comparative) (Wt %) | Composition D (Comparative) (Wt %) |
|---|---|---|---|
| Poly(vinyl butyral) | 47.7 | 49.2 | 46.7 |
| SR 368 | 23.4 | 22.6 | 25.9 |
| SR 9008 | 23.4 | 22.6 | 25.9 |
| Cyanine Dye | 0.23 | 0.22 | 0.26 |
| CD1012 | 0.93 | 0.90 | 1.03 |
| CGI 7460 | 0.25 | 0.24 | 0.28 |
| (CdSe)ZnS Nanoparticles | 4.23 | 0 | 0 |
| Bulk CdSe | 0 | 4.35 | 0 |

The coated slides were exposed using a diode pumped Ti:sapphire laser (Spectra-Physics) operating at a wavelength of 800 nm, pulse width 80 fs, pulse repetition rate of 80 MHz, beam diameter of approximately 2 mm. The optical train consisted of low dispersion turning mirrors, an optical attenuator to vary the optical power, and a 60× microscope objective (N.A. 0.85) to focus the light. Each coated slide was exposed to the light by continuously moving the slide beneath the microscope objective. The focal point of the light beam was positioned to coincide with the slide/coating interface. The average power delivered to the coated slide (22 mW) was measured where the beam exited the microscope objective using a calibrated photodiode. Each slide was moved underneath the focused beam using a computer controlled, 3-axis stage.

To test the photosensitivity of each photoreactive composition, a series of polymer lines were created by scanning each coated slide under the focused beam at speeds ranging from 77 μm/s to 40 mm/s. Following exposure, unreacted resin was removed by solvent development in propylene glycol methyl ether acetate, and the slides were then rinsed with isopropyl alcohol and air dried. Each slide was then examined under an optical microscope, and a threshold writing speed was determined from the number of polymer lines remaining on the slide. Table 2 summarizes the results. The maximum photosensitivity was observed for the composition of the invention, Composition B. No reaction was observed for either of the comparative compositions (Compositions C and D), indicating that the threshold writing speeds for these compositions were less than 0.033 mm/s.

TABLE 2

Threshold Writing Speed

| Composition | Threshold Writing Speed (mm/s) |
|---|---|
| B | 2.13 |

TABLE 2-continued

Threshold Writing Speed

| Composition | Threshold Writing Speed (mm/s) |
|---|---|
| C (Comparative) | <0.033 |
| D (Comparative) | <0.033 |

Example 2

Multiphoton Photopolymerization Using (ZnSe)ZnS Nanoparticles

Multiphoton photopolymerization was effected using a photoinitiator system consisting of ZnSe nanoparticles and an electron acceptor.

Preparation of ZnSe Nanoparticles

ZnSe nanoparticles were prepared as described below, using a slight modification of a published synthesis, *J. Phys. Chem. B*, 102(19), 3655 (1998). Using standard airless techniques, 56.25 g (75 mL) of hexadecylamine was dried and degassed under vacuum at 125° C. for 2 hours. The hexadecylamine was then heated to 310° C. under 1 atm. of nitrogen. 0.41 mL (4 mmol) of diethyl zinc (Aldrich Chemical Company) was mixed with 20 mL trioctylphosphine (Fluka Chemicals, Steinheim, Germany) and 5 mL of 1 M trioctylphosphine selenide in trioctylphosphine. The resulting solution was then rapidly injected into the vigorously stirred hexadecylamine at 310° C. The temperature of the resulting solution was reduced to 280° C. After 2 hours, diethyl zinc (Aldrich, 0.35 mL, 3 mmol) was mixed with 12 mL trioctylphosphine and 5 mL of 1 M trioctylphosphine selenide in trioctylphosphine and added dropwise to the solution over eight minutes. After 2 more hours, diethyl zinc (Aldrich, 0.35 mL, 3 mmol) was mixed with 12 mL trioctylphosphine and 5 mL of 1 M trioctylphosphine selenide in trioctylphosphine and added dropwise to the solution over 8 minutes. The resulting transparent, golden yellow solution was held at 280° C. for 3.5 hours and then cooled to 100° C.

A 40 mL aliquot of the solution was added to 10 mL 1-butanol in an 8-ounce screw cap jar with a one inch Teflon™ poly(tetrafluoroethylene) (available from DuPont) coated stir bar. The jar was put into a water bath at 68° C., and the solution was stirred. ZnSe nanoparticles were precipitated by the addition of 80 mL methanol using a 25 mL burette. The nanoparticles were isolated by centrifugation (4000 RPM) of the warm slurry followed by decantation of the liquid portion. The nanoparticles were then dissolved into 1 mL toluene and centrifuged (4000 RPM) to remove a small amount of black residue. The particle diameter was estimated at 40 Å (4 nm) based on transmission electron microscopy measurements. The toluene solution was determined to contain 1.31 mmol ZnSe by ultraviolet-visible (UV-Vis) absorption spectroscopy, using the method published by C. A. Leatherdale, W.-K. Woo, F. V. Mikulec, and M. G. Bawendi in *J. Phys. Chem. B* 106, 7619 (2002).

Preparation of ZnS-Overcoated ZnSe Nanoparticles

ZnS-overcoated ZnSe nanoparticles were prepared by slight modification of a published method, *J. Phys Chem. B* 101, 9463 (1997). Using standard airless techniques, 60 mL of trioctylphosphine (Fluka Chemicals, Steinheim, Germany) was dried and degassed under vacuum at 105° C. for 2 hours. The ZnSe nanoparticles prepared above (1.31 mmol ZnSe) in ca. 1 mL toluene were injected into the trioctylphosphine, and the resulting mixture was heated to 205° C. under 1 atm. of nitrogen. Diethyl zinc (Aldrich, 0.25 mL, 2.4 mmol) was mixed with 30 mL trioctylphosphine and 0.5 mL of bis(trimethylsilyl)sulfide (Fluka). The resulting solution was then added dropwise to the stirred trioctylphosphine solution of ZnSe nanoparticles at 205° C. over 80 minutes. The temperature of the resulting solution was then reduced to 135° C. for 3.5 hours.

The solution was transferred to a 16-ounce screw cap jar with a one inch Teflon™ poly(tetrafluoroethylene) (available from DuPont) coated stir bar. ZnS-overcoated ZnSe nanoparticles were precipitated by the addition of 41 mL methanol and 275 mL 2-propanol using a 25 mL burette. The nanoparticles were isolated by centrifugation (4000 RPM) of the warm slurry followed by decantation of the liquid portion. The nanoparticles were then dissolved into 1 mL toluene and centrifuged (4000 RPM) to remove a small amount of black residue. Using the ultraviolet-visible absorption spectroscopy method published by C. A. Leatherdale, W.-K. Woo, F. V. Mikulec, and M. G. Bawendi in *J. Phys. Chem. B* 106, 7619 (2002), the solution was determined to contain 0.78 M ZnSe in the form of ZnSe nanoparticles overcoated with a shell of ZnS.

Multiphoton Photopolymerization

A stock solution of 1.0 wt % CD1012, 4.3 wt % tetrahydrofuran (Burdick & Jackson, Muskegon, Mich.) 47.3 wt % lauryl acrylate (SR335), 23.7 wt % tris(2-hydroxyethyl) isocyanurate triacrylate (SR368), and 23.7 wt % alkoxylated trifunctional acrylate ester (SR 9008) (all three acrylates available from Sartomer Co., West Chester, Pa.) was prepared in an amber vial and allowed to stir for 20 minutes until the CD1012 was completed dissolved. A 0.1 g aliquot of this stock solution was then placed in another amber vial. 0.02 mL of the above-described solution of ZnS-overcoated ZnSe nanoparticles in toluene was added to the stock solution to form an optically clear solution (hereinafter, Composition E). As a comparative, a 0.5 g aliquot of the stock solution was placed in a separate vial, and 0.1 mL of pure toluene was added to form Composition F (Comparative). Both compositions were allowed to stir overnight in a light-tight container.

One or two drops of each composition were placed in separate regions on a microscope slide, and a cover slip was placed on top. A drop of solution containing a highly fluorescent, multiphoton absorbing dye (bis-[4-diphenylamino)styryl]-1-(2-ethylhexyloxy)-4-(methoxy) benzene) was placed on the same slide to be used as a reference in determining the correct focal position. Exposure of the compositions was carried out by continuously moving the slide beneath the highly focused light from a 60× microscope objective (NA 0.85). The focal point of the beam was positioned to coincide with the slide/composition interface. The light source was a diode pumped Ti:sapphire laser (Spectra-Physics) operating at a wavelength of 800 nm, pulse width 80 fs, pulse repetition rate of 80 MHz, beam diameter of approximately 2 mm. The optical train consisted of low dispersion turning mirrors and an optical attenuator to vary the optical power. The average power delivered to the slide (45 mW) was measured where the beam exited the microscope objective using a calibrated photodiode. The slide was moved underneath the focused beam using a computer controlled, 3-axis stage.

To test the photosensitivity of each composition, a series of polymer lines was created by scanning the slide under the focused beam at speeds ranging from 77 μm/s to 40 mm/s. For each speed test, the stage was scanned back and forth along the X-direction four times with a one micron increment in the Y-direction after each pass so as to form approximately eight micron wide lines. Following exposure, unreacted resin was removed by solvent development in isopropyl alcohol. During the development process, the cover slip was gently floated off the microscope slide, exposing the polymerized lines. The slide was then examined under an optical microscope, and a threshold writing speed was determined from the number of polymer lines remaining on the slide for each composition. For the composition of the invention, Composition E, the threshold writing speed was approximately 1.75 mm/s. No image was obtained for the comparative composition, Composition F.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A photoreactive composition comprising
   (a) at least one reactive species that is capable of undergoing an acid- or radical-initiated chemical reaction; and
   (b) a photoinitiator system comprising photochemically-effective amounts of
      (1) at least one type of semiconductor nanoparticle quantum dot that has at least one electronic excited state that is accessible by absorption of two or more photons, and
      (2) a composition, different from said reactive species, that is capable of interacting with said excited state of said semiconductor nanoparticle quantum dot to form at least one reaction-initiating species.

2. The composition of claim 1 wherein said reactive species is a curable species.

3. The composition of claim 2 wherein said curable species is selected from the group consisting of monomers, oligomers, reactive polymers, and mixtures thereof.

4. The composition of claim 3 wherein said curable species is selected from the group consisting of addition-polymerizable monomers and oligomers, addition-crosslinkable polymers, cationically-polymerizable monomers and oligomers, cationically-crosslinkable polymers, and mixtures thereof.

5. The composition of claim 1 wherein said reactive species is a non-curable species.

6. The composition of claim 1 wherein said reactive species is capable of undergoing a radical-initiated chemical reaction.

7. The composition of claim 1 wherein said semiconductor nanoparticle quantum dot comprises a semiconductor selected from the group consisting of Group IV, Group III-V, Group II-VI, and Group I-VII semiconductors.

8. The composition of claim 7 wherein said semiconductor is a Group IV or a Group II-VI semiconductor.

9. The composition of claim 8 wherein said semiconductor is a Group II-VI semiconductor.

10. The composition of claim 9 wherein said semiconductor comprises zinc or cadmium.

11. The composition of claim 1 wherein said semiconductor nanoparticle quantum dots have an average diameter in the range of about 1.5 nm to about 30 nm.

12. The composition of claim 1 wherein said semiconductor nanoparticle quantum dots have an average radius less than or equal to the Bohr exciton radius of said semiconductor.

13. The composition of claim 1 wherein said semiconductor nanoparticle quantum dots have surface-attached or surface-bonded organic groups that serve to compatibilize said semiconductor nanoparticle quantum dots and said reactive species.

14. The composition of claim 1 wherein said semiconductor nanoparticle quantum dots are core/shell semiconductor nanoparticle quantum dots.

15. The composition of claim 1 wherein said semiconductor nanoparticle quantum dot has at least one electronic excited state that is accessible by simultaneous absorption of two or more photons.

16. The composition of claim 1 wherein said composition that is capable of interacting with said excited state of said semiconductor nanoparticle quantum dot to form at least one reaction-initiating species comprises (a) at least one one-photon photoinitiator that has an electronic absorption band that overlaps with an up-converted electronic emission band of said semiconductor nanoparticle quantum dot; or (b) at least one electron donor compound and/or at least one electron acceptor compound.

17. The composition of claim 16 wherein said one-photon photoinitiator is selected from the group consisting of free-radical photoinitiators that generate a free radical source and cationic photoinitiators that generate an acid when exposed to ultraviolet or visible radiation.

18. The composition of claim 17 wherein said free-radical photoinitiators are selected from the group consisting of acetophenones, benzophenones, aryl glyoxalates, acylphosphine oxides, benzoin ethers, benzil ketals, thioxanthones, chloroalkyltriazines, bisimidazoles, triacylimidazoles, pyrylium compounds, sulfonium salts, iodonium salts, mercapto componds, quinones, azo compounds, organic peroxides, and mixtures thereof; and said cationic photoinitiators are selected from the group consisting of metallocene salts having an onium cation and a halogen-containing complex anion of a metal or metalloid, metallocene salts having an organometallic complex cation and a halogen-containing complex anion of a metal or metalloid, iodonium salts, sulfonium salts, and mixtures thereof.

19. The composition of claim 1 wherein said composition that is capable of interacting with said excited state of said semiconductor nanoparticle quantum dot to form at least one reaction-initiating species comprises (1) at least one one-photon photosensitizer having an electronic absorption band that overlaps with an up-converted electronic emission band of said semiconductor nanoparticle quantum dot; and (2) either or both of (i) at least one electron donor compound different from said one-photon photosensitizer and capable of donating an electron to an electronic excited state of said one-photon photosensitizer; and (ii) at least one electron acceptor compound that is capable of being photosensitized by accepting an electron from an electronic excited state of said one-photon photosensitizer, resulting in the formation of at least one free radical and/or acid.

20. The composition of claim 19 wherein said composition comprises both said electron donor compound and said electron acceptor compound.

21. The composition of claim 19 wherein said one-photon photosensitizer is capable of absorbing light within the range of wavelengths between about 250 and about 800 nanometers and is capable of sensitizing 2-methyl-4,6-bis(trichloromethyl)-s-triazine.

22. The composition of claim 19 wherein said one-photon photosensitizer is selected from the group consisting of ketones, coumarin dyes, xanthene dyes, acridine dyes, thiazole dyes, thiazine dyes, oxazine dyes, azine dyes, aminoketone dyes, porphyrins, aromatic polycyclic hydrocarbons, p-substituted aminostyryl ketone compounds, aminotriaryl methanes, merocyanines, squarylium dyes, cyanine dyes, pyridinium dyes, and mixtures thereof.

23. The composition of claim 19 wherein said one-photon photosensitizer is selected from the group consisting of xanthene dyes, cyanine dyes, ketones, ketocoumarins, aminoarylketones, p-substituted aminostyryl ketone compounds, and mixtures thereof.

24. The composition of claim 19 wherein said one-photon photosensitizer is selected from the group consisting of rose bengal, 3-methyl-2-[(1E,3E)-3-(3-methyl-1,3-benzothiazol-2(3H)-ylidene)prop-1-enyl]-1,3-benzothiazol-3-ium iodide, camphorquinone, glyoxal, biacetyl, 3,3,6,6-tetramethylcyclohexanedione, 3,3,7,7-tetramethyl-1,2-cycloheptanedione, 3,3,8,8-tetramethyl-1,2-cyclooctanedione, 3,3,18,18-tetramethyl-1,2-cyclooctadecanedione, dipivaloyl, benzil, furil, hydroxybenzil, 2,3-butanedione 2,3-pentanedione, 2,3-hexanedione, 3,4-hexanedione, 2,3-heptanedione, 3,4-heptanedione, 2,3-octanedione, 4,5-octanedione, 1,2-cyclohexanedione, and mixtures thereof.

25. The composition of claim 16 or claim 19 wherein said electron donor compound has an oxidation potential that is greater than zero and less than or equal to that of p-dimethoxybenzene.

26. The composition of claim 16 or claim 19 wherein said electron donor compound has an oxidation potential between about 0.3 and 2 volts vs. a standard saturated calomel electrode.

27. The composition of claim 16 or claim 19 wherein said electron donor compound is selected from the group consisting of amines, amides, ethers, ureas, sulfinic acids and their salts, salts of ferrocyanide, ascorbic acid and its salts, dithiocarbamic acid and its salts, salts of xanthates, salts of ethylene diamine tetraacetic acid, salts of $(alkyl)_n(aryl)_m$ borates (n+m=4), $SnR_4$ compounds (where each R is independently chosen from the group consisting of alkyl, aralkyl, aryl, and alkaryl groups), ferrocene, and mixtures thereof.

28. The composition of claim 27 wherein said electron donor compound is selected from the group consisting of amines that contain one or more julolidinyl moieties, alkylarylborate salts, salts of aromatic sulfinic acids, 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, 1,2,4-trimethoxybenzene, and mixtures thereof.

29. The composition of claim 16 or claim 19 wherein said composition contains no said electron donor compound.

30. The composition of claim 16 or claim 19 wherein said electron acceptor compound is selected from the group consisting of iodonium salts, sulfonium salts, diazonium salts, azinium salts, chloromethylated triazines, triarylimidazolyl dimers, and mixtures thereof.

31. The composition of claim 30 wherein said electron acceptor compound is selected from the group consisting of iodonium salts, chloromethylated triazines, triarylimidazolyl dimers, sulfonium salts, diazonium salts, and mixtures thereof.

32. The composition of claim 31 wherein said electron acceptor compound is selected from the group consisting of aryliodonium salts, chloromethylated triazines, 2,4,5-triphenylimidazolyl dimers, and mixtures thereof.

33. The composition of claim 1 wherein said composition comprises from about 5% to about 99.79% by weight of said reactive species, from about 0.01% to about 10% by weight of said semiconductor nanoparticle quantum dot, and from about 0.1% to about 15% by weight of said composition that is capable of interacting with said excited state of said semiconductor nanoparticle quantum dot to form at least one reaction-initiating species.

34. A photoreactive composition comprising
 (a) at least one curable species that is capable of undergoing a radical-initiated chemical reaction; and
 (b) a photoinitiator system comprising photochemically-effective amounts of
  (1) at least one core/shell semiconductor nanoparticle quantum dot that has at least one electronic excited state that is accessible by simultaneous absorption of two or more photons, and
  (2) a composition that is capable of interacting with said excited state of said semiconductor nanoparticle quantum dot to form at least one reaction-initiating species.

35. The composition of claim 34 wherein said composition that is capable of interacting with said excited state of said semiconductor nanoparticle quantum dot to form at least one reaction-initiating species comprises (a) at least one one-photon photoinitiator that has an electronic absorption band that overlaps with an up-converted electronic emission band of said semiconductor nanoparticle quantum dot; or (b) at least one electron donor compound and/or at least one electron acceptor compound.

36. The composition of claim 34 wherein said composition that is capable of interacting with said excited state of said semiconductor nanoparticle quantum dot to form at least one reaction-initiating species is different from said reactive species.

37. A composition resulting from reaction of the composition of claim 1, claim 2, or claim 34.

38. An article comprising the composition of claim 37.

* * * * *

UNITED STATES PATENT AND TRADEMARK OFFICE
CERTIFICATE OF CORRECTION

PATENT NO.       : 7,381,516 B2
APPLICATION NO.  : 10/263116
DATED            : June 3, 2008
INVENTOR(S)      : David S. Arney It is certified that error appears in the above-identified patent and that said Letters Patent is hereby corrected as shown below:

Title Page - Column 2 (U.S. Patent Documents)
Line 32;    Delete "2004/0057451" and insert -- 2004/0067451 --, therefor.

Title Page - Column 2 (Other Publications)
Line 4;     Delete "Berlmann" and insert -- Berlman --, therefor.
Line 9;     Delete "Hubber" and insert -- Huber --, therefor.

Page 2 - Column 1 (Other Publications)
Line 9;     Delete "198." and insert -- 198 (2001). --, therefor.

Column 12
Line 42;    Delete "componds," and insert -- compounds, --, therefor.

Column 17
Line 38-39; Delete "(aryl)mborates" and insert -- $(aryl)_m$borates --, therefor.

Column 18
Line 4;     Delete "aamine," and insert -- amine, --, therefor.

Column 27
Line 46;    Delete "Company,West" and insert -- Company, West --, therefor.

Column 30
Line 24-25; Delete "tetahydrofuran" and insert -- tetrahydrofuran --, therefor.

Column 32
Line 33;    In Claim 18, delete "componds," and insert -- compounds, --, therefor.

Signed and Sealed this
Twenty-ninth Day of March, 2011

David J. Kappos
*Director of the United States Patent and Trademark Office*

Column 33
Line 18;   In Claim 24, after "butanedione" insert -- , --.